(12) United States Patent
Tsai

(10) Patent No.: US 12,477,780 B2
(45) Date of Patent: Nov. 18, 2025

(54) SEMICONDUCTOR STRUCTURE INCLUDING MULTIPLE GATE ELECTRODES

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 449 days.

(21) Appl. No.: 18/083,943

(22) Filed: Dec. 19, 2022

(65) Prior Publication Data

US 2024/0204072 A1 Jun. 20, 2024

(51) Int. Cl.
| | |
|---|---|
| *H10D 30/63* | (2025.01) |
| *H10D 30/60* | (2025.01) |
| *H10D 30/67* | (2025.01) |
| *H10D 62/17* | (2025.01) |
| *H10D 62/82* | (2025.01) |

(52) U.S. Cl.
CPC ....... *H10D 30/6735* (2025.01); *H10D 30/611* (2025.01); *H10D 30/63* (2025.01); *H10D 62/235* (2025.01); *H10D 62/82* (2025.01)

(58) Field of Classification Search
None
See application file for complete search history.

(56) References Cited

U.S. PATENT DOCUMENTS

| | | | | |
|---|---|---|---|---|
| 2012/0241826 | A1* | 9/2012 | Satoh | H10B 61/22 257/295 |
| 2017/0358497 | A1* | 12/2017 | Cheng | H01L 21/02532 |
| 2018/0197988 | A1* | 7/2018 | Ratnam | H10D 30/025 |
| 2019/0214432 | A1* | 7/2019 | Kim | H10B 61/22 |
| 2021/0265358 | A1* | 8/2021 | Tsai | H10B 12/05 |
| 2023/0363136 | A1* | 11/2023 | Xiao | H10B 12/315 |

FOREIGN PATENT DOCUMENTS

| | | |
|---|---|---|
| TW | 201133841 A | 10/2011 |
| TW | 201926460 A | 7/2019 |
| TW | 202201742 A | 1/2022 |
| TW | 202205641 A | 2/2022 |

OTHER PUBLICATIONS

Office Action and and the search report mailed on Nov. 30, 2023 related to Taiwanese Application No. 112111185.
(Continued)

*Primary Examiner* — Sue A Purvis
*Assistant Examiner* — Carnell Hunter
(74) *Attorney, Agent, or Firm* — Xuan Zhang

(57) ABSTRACT

The present disclosure provides a semiconductor structure. The semiconductor structure includes: a first doped structure over a substrate and a second doped structure over the first doped structure and the substrate; a first gate layer, at last partially disposed between the first doped structure and the second doped structure; a first gate dielectric layer, surrounding the first gate layer; a channel layer, surrounding the first gate dielectric layer; a second gate dielectric layer, surrounding the channel layer; and a second gate layer, surrounding the second gate dielectric layer. A manufacturing method for forming the same is also provided.

19 Claims, 24 Drawing Sheets

(56) References Cited

OTHER PUBLICATIONS

H. Fujiwara, Y. Sato, N. Saito, T. Ueda and K. Ikeda, "Surrounding Gate Vertical-Channel FET With a Gate Length of 40 nm Using BEOL-Compatible High-Thermal-Tolerance In—Al—Zn Oxide Channel," in IEEE Transactions on Electron Devices, vol. 67, No. 12, pp. 5329-5335, Dec. 2020, doi: 10.1109/TED.2020.3021996.

X. Duan et al., "Novel Vertical Channel-All-Around (CAA) In—Ga—Zn—O FET for 2T0C-DRAM With High Density Beyond 4F2 by Monolithic Stacking," in IEEE Transactions on Electron Devices, vol. 69, No. 4, pp. 2196-2202, Apr. 2022, doi: 10.1109/TED.2022.3154693.

Office Action and and the search report mailed on Jul. 4, 2024 related to Taiwanese Application No. 113103362.

\* cited by examiner

SEMICONDUCTOR STRUCTURE INCLUDING MULTIPLE GATE ELECTRODES

TECHNICAL FIELD

The present disclosure relates to a vertical gate-all-around (GAA) structure and a method for forming the same. Particularly, the present disclosure relates to a GAA structure including multiple gate electrodes and a method for forming the same.

DISCUSSION OF THE BACKGROUND

Semiconductor devices are used in a variety of electronic applications, such as personal computers, cellular phones, digital cameras, and other electronic equipment.

A field-effect transistor (FET) is optimized for logic and memory devices and has short gates. Other structures of FETs are manufactured to optimize for I/O devices and have long gates that allow for increased current density, improved thermal characteristics, etc. As the semiconductor industry has progressed into advanced technology process nodes in pursuit of greater device density, challenges of threshold voltage variation have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure comprises: a first doped structure over a substrate and a second doped structure over the first doped structure and the substrate; a first gate layer, at last partially disposed between the first doped structure and the second doped structure; a first gate dielectric layer, surrounding the first gate layer; a channel layer, surrounding the first gate dielectric layer; a second gate dielectric layer, surrounding the channel layer; and a second gate layer, surrounding the second gate dielectric layer.

In some embodiments, the first gate layer penetrates the second doped structure.

In some embodiments, the first gate dielectric layer penetrates the second doped structure.

In some embodiments, an entirety of the channel layer is disposed between the first doped structure and the second doped structure.

In some embodiments, an entirety of the second gate dielectric layer is disposed between the first doped structure and the second doped structure.

In some embodiments, an entirety of the second gate layer is disposed below the second doped structure.

In some embodiments, the semiconductor structure further comprises: a first spacer layer, separating the second gate layer from the first doped structure; and a second spacer layer, separating the second gate layer from the second doped structure In some embodiments, a first thickness of the first gate dielectric layer adjacent to a bottom of the first gate layer is different from a second thickness of the first gate dielectric layer adjacent to a sidewall of the first gate layer.

In some embodiments, the first thickness is greater than the second thickness.

In some embodiments, the channel layer contacts the first doped structure and the second doped structure.

Another aspect of the present disclosure provides a semiconductor structure. The semiconductor structure further comprises: a vertical gate-all-around (GAA) structure; a first contact; and a second contact. The GAA structure comprises: a gate structure; and a first doped structure and a second doped structure, disposed at two opposite sides of the gate structure respectively. The gate structure comprises: an inner gate; an inner oxide, surrounding the inner gate; a channel layer, surrounding the inner oxide; an outer oxide, surrounding the channel layer; and an outer gate, surrounding the outer oxide. The first contact electrically connects the inner gate. The second spacer layer separates the second gate layer from the second doped structure.

In some embodiments, the first doped structure is disposed at a lower end of the gate structure.

In some embodiments, the second doped structure is penetrated by the inner gate and the inner oxide.

In some embodiments, the second doped structure connects an upper end of the channel layer and an upper end of the outer oxide.

In some embodiments, the inner oxide encircles the inner gate, the channel layer encircles the inner oxide, the outer oxide encircles the channel layer, and the outer gate encircles the outer oxide from a top-view perspective.

In some embodiments, the semiconductor structure further comprises: a third contact, electrically connected to the first doped structure; and a fourth contact, electrically connected to the second doped structure.

In some embodiments, the third contact and the fourth contact are electrically isolated from each other.

In some embodiments, the first contact and the second contact are electrically isolated from each other.

In some embodiments, the channel layer includes indium gallium zinc oxide (IGZO).

In some embodiments, the GAA structure further comprises a spacer structure, disposed between the outer gate and the first doped structure, and between the outer gate and the second doped structure.

Another aspect of the present disclosure provides a method for manufacturing a semiconductor structure. The method includes a number of operations. A first spacer layer, a first gate layer and a second spacer layer are sequentially formed over a substrate. A first opening penetrating the first spacer layer, the first gate layer and the second spacer layer is defined. A first gate dielectric layer, a channel layer, a second gate dielectric layer and a second gate layer are sequentially formed within the first opening.

In some embodiments, the method further comprises: performing a patterning operation on the first spacer layer, the first gate layer and the second spacer layer.

In some embodiments, the formation of the first gate dielectric layer comprises: depositing a first dielectric material lining the first opening; and removing a portion of the first dielectric material at a bottom of the first opening to form the first gate dielectric layer.

In some embodiments, the channel layer contacts the bottom of the first opening.

In some embodiments, the formation of the channel layer comprises: depositing a channel material filling the first opening after the formation of the first gate dielectric layer.

In some embodiments, the method further comprises: forming a first semiconductive layer over the channel material; and defining a second opening penetrating the first semiconductive layer and stopping in the channel material to form the channel layer.

In some embodiments, the formations of the second gate dielectric layer and the second gate layer comprise: depositing a second dielectric material filling the second opening; defining a third opening in the second dielectric material to form the second gate dielectric layer; and depositing a gate material filling the third opening to form the second gate layer.

In some embodiments, a thickness of the second gate dielectric layer at a bottom of the second opening is greater than a thickness of the second gate dielectric layer at a sidewall of the second opening.

In some embodiments, the formation of the second gate dielectric layer comprises: depositing a second dielectric material lining the second opening to form the second gate dielectric layer.

In some embodiments, a thickness of the second gate dielectric layer at a bottom of the second opening is substantially equal to a thickness of the second dielectric layer at a sidewall of the second opening.

In some embodiments, a top surface of the second gate layer is above a top surface of the first semiconductive layer.

In some embodiments, the method further comprises: forming a second semiconductive material over the substrate prior to the formation of the first spacer layer.

In some embodiments, the first opening stops on the second semiconductive material.

In some embodiments, the channel layer includes indium gallium zinc oxide (IGZO).

In some embodiments, the first gate layer or the second gate layer includes aluminum (Al), copper (Cu), tungsten (W), titanium (Ti), tantalum (Ta), tantalum aluminum (TaAl), tantalum aluminum nitride (TaAlN), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), or combinations thereof.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
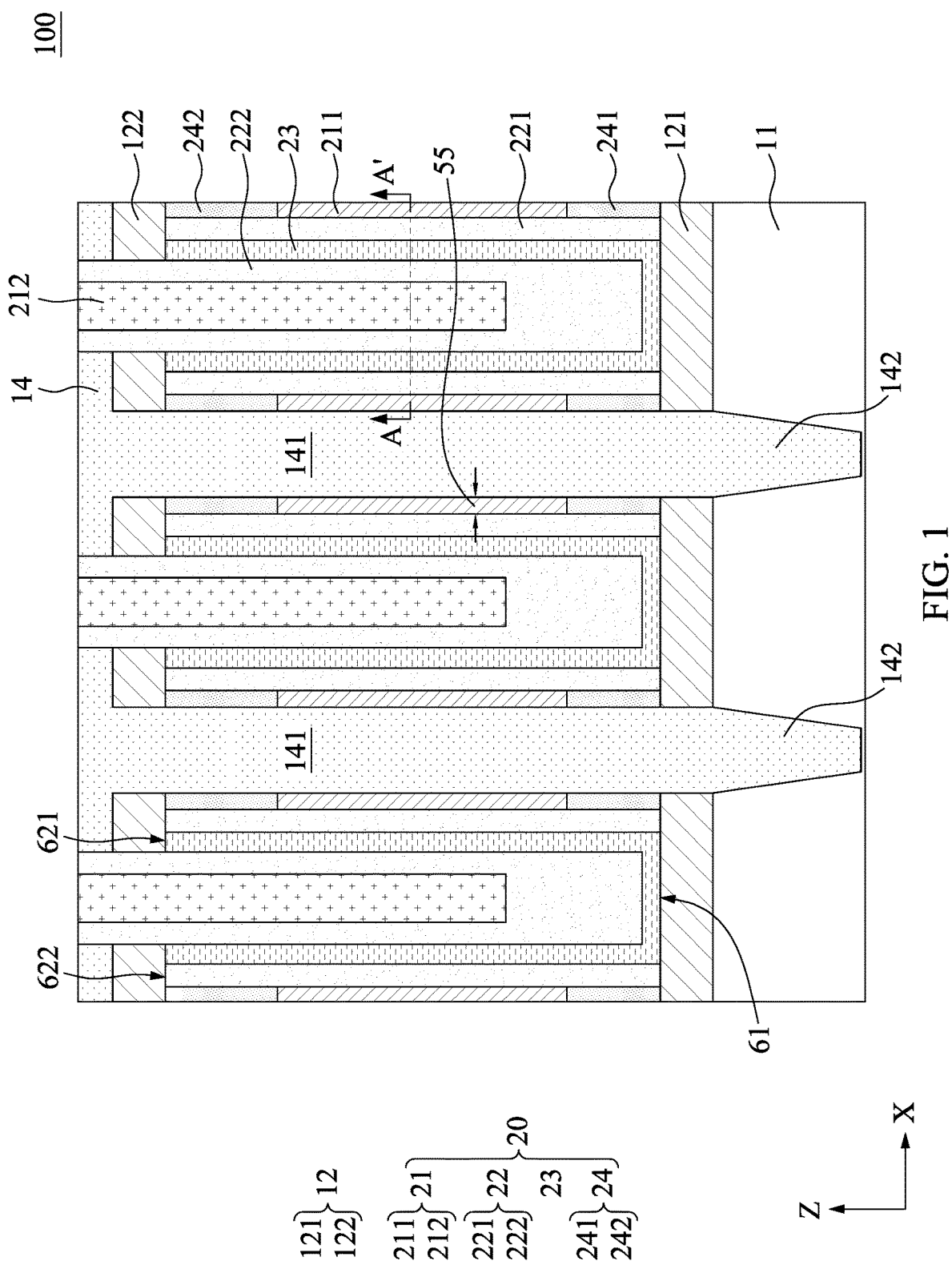
FIG. 1 is a schematic cross-sectional diagram of a semiconductor structure including multiple GAA structures in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional diagram of a semiconductor structure 100 including multiple GAA structures in accordance with some embodiments of the present disclosure. The multiple GAA structures of the semiconductor structure 100 are separated by multiple trench isolations 141 disposed between the GAA structures. In some embodiments, the trench isolations 141 extend into a substrate 11, on which the GAA structures are formed. In some embodiments, at least one of the trench isolations 141 connects to a shallow trench isolation (STI) 142 disposed in the substrate 11. In some embodiments, the trench isolation 141 and the STI 142 are collectively referred to as an isolation structure 14.

In some embodiments, the substrate 11 is a bulk semiconductor, a semiconductor-on-insulator (SOI) substrate, or the like. The substrate 11 may be of a first conductivity type, e.g., a P-type semiconductive substrate (acceptor type), or of a second conductivity type, e.g., an N-type semiconductive substrate (donor type). In some embodiments, the substrate 11 may include a doped epitaxial layer, a gradient semiconductor layer, or a semiconductor layer overlaying another semiconductor layer of a different type, such as a silicon layer on a silicon germanium layer.

Each of the GAA structures may be a vertical GAA field-effect transistor (FET) and include doped structures 12 and a gate structure 20. In some embodiments, the doped structures 12 function as source/drain structures of a FET. In some embodiments, the doped structures 12 include a first doped structure 121 disposed over the substrate 11 and a second doped structure 122 disposed over the first doped structure 121. In some embodiments, the doped structures 12 individually can include N-type dopants or P-type dopants depending on a conductivity type of the GAA structure.

The gate structure 20 may be disposed between the first doped structure 121 and the second doped structure 122. In some embodiments, the first doped structure 121 and the second doped structure 122 are disposed at two opposite sides of the gate structure 20. In some embodiments, the first doped structure 121 is disposed at a lower end 61 of the gate structure 20.

The gate structure 20 can include gate layers 21, gate dielectric layers 22, a channel layer 23 and a spacer structure 24. In some embodiments, the second doped structure 122 connects to or contacts an upper end 621 of the channel layer 23. In some embodiments, the gate layer 21 includes an inner gate layer 212 and an outer gate layer 211 surrounding the inner gate layer 212. In some embodiments, the inner gate layer 212 is partially disposed between the first doped structure 121 and the second doped structure 122. In some embodiments, a portion of the inner gate layer 212 penetrates the second doped structure 122. In some embodiments, a portion of the inner gate layer 212 is disposed above the second doped structure 122.

In some embodiments, the gate dielectric layers 22 includes an inner dielectric layer 222 surrounding the inner gate layer 212, and an outer dielectric layer 221 surrounded by the outer gate layer 211. In some embodiments for a purpose of normal function of the GAA structure, a thickness 55 of the outer gate layer 211 adjacent to sidewalls of the outer dielectric layer 221 is greater than 1 nanometer (nm). In some embodiments, the thickness 55 is in a range of 2 to 10 nm. In some embodiments, the second doped structure 122 is disposed over an upper end 622 of the outer dielectric layer 221. In some embodiments, the inner dielectric layer 222 is partially disposed between the first doped structure 121 and the second doped structure 122. In some embodiments, a portion of the inner dielectric layer 222 penetrates the second doped structure 122. In some embodiments, a portion of the inner dielectric layer 222 is disposed above the second doped structure 122.

In some embodiments, an entirety of the channel layer 23 is disposed between the first and second doped structures 121 and 122. In some embodiments, the channel layer 23 is disposed between the outer gate layer 211 and the inner gate layer 212. More specifically, the channel layer 23 may be disposed between the outer dielectric layer 221 and the inner dielectric layer 222. In some embodiments, the channel layer 23 surrounds the inner dielectric layer 222 and is surrounded by the outer dielectric layer 221. In some embodiments, the channel layer 23 includes indium gallium zinc oxide (IGZO), indium zinc oxide (IZO), aluminum gallium zinc oxide (AGZO), aluminum indium zinc oxide (AIZO), or a combination thereof.

The spacer structure 24 is for a purpose of electrical isolation of the doped structures 12 from the gate structure 20. In some embodiments, the spacer structure 24 includes a first spacer layer 241 disposed between and separating the outer gate layer 211 and the first doped structure 121, and a second spacer layer 242 disposed between and separating the outer gate layer 211 and the second doped structure 122. In some embodiments, the spacer layers 241 and 242 individually surround a portion of the gate structure 20. In some embodiments, a lower portion and an upper portion of the outer dielectric layer 221 are surrounded by the first and second spacer layers 241 and 242, respectively. In some embodiments, a lower portion and an upper portion of the channel layer 23 are surrounded by the first and second spacer layers 241 and 242, respectively. In some embodiments, a lower portion and an upper portion of the inner dielectric layer 222 are surrounded by the first and second spacer layers 241 and 242, respectively. In some embodiments, an upper portion of the inner gate layer 212 is surrounded by the second spacer layer 242 as shown in FIG. 1. In alternative embodiments, a lower portion of the inner gate layer 212 can be surrounded by the second spacer layer 242 (not shown in FIG. 1).

In some embodiments, the outer dielectric layer 221 extends along a first direction (e.g., Z direction) between the first doped structure 121 and the second doped structure 122. In some embodiments, an entirety of the outer dielectric layer 221 is above the first doped structure 121 and below the second doped structure 122. In some embodiments, the outer dielectric layer 221 contacts the first doped structure 121 and the second doped structure 122. In some embodiments, the channel layer 23 extends along the first direction between the first doped structure 121 and the second doped structure 122. In some embodiments, an entirety of the channel layer 23 is above the first doped structure 121 and below the second doped structure 122. In some embodiments, the channel layer 23 contacts the first doped structure 121 and the second doped structure 122. In some embodiments, sidewalls of the channel layer 23 contact the outer dielectric layer 221, and a bottom of the channel layer 23 contacts the first doped structure 121 without overlapping the outer dielectric layer 221.

In some embodiments, the inner dielectric layer 222 extends along the first direction from the first doped structure 121 toward the second doped structure 122. In some embodiments, an entirety of the inner dielectric layer 222 is above the first doped structure 121. In some embodiments, an upper portion of the inner dielectric layer 222 penetrates the second doped structure 122. In some embodiments, some of the upper portion of the inner dielectric layer 222 is above the second doped structure 122. In some embodiments, the inner dielectric layer 222 contacts the second doped structure 122. In some embodiments, the inner dielectric layer 222 is separated from the first doped structure 121 by the channel layer 23. A thickness of the inner dielectric layer 222 can be substantially consistent or can be different at different portions thereof depending on different processing. In some embodiments, a thickness of a bottom portion of the inner dielectric layer 222 is greater than a thickness of a vertical portion of the inner dielectric layer 222.

In some embodiments, the inner gate layer 212 extends along the first direction from the first doped structure 121 toward the second doped structure 122. In some embodiments, an entirety of the inner gate layer 212 is above the first doped structure 121. In some embodiments, an upper portion of the inner gate layer 212 penetrates the second doped structure 122. In some embodiments, some of the upper portion of the inner gate layer 212 is above the second doped structure 122. In some embodiments, the inner gate layer 212 is separated from the second doped structure 122 by the inner dielectric layer 222. In some embodiments, the inner gate layer 212 is separated from the first doped structure 121 by the channel layer 23 and the inner dielectric layer 222.

Figure 2:
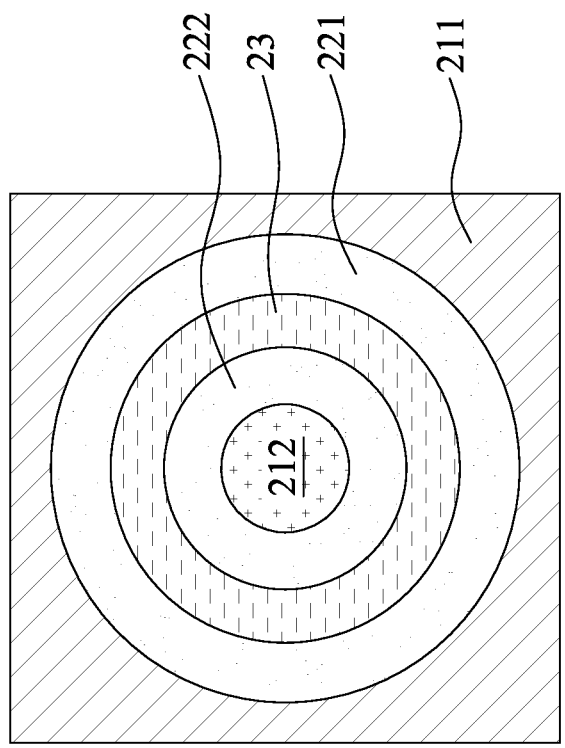
FIG. 2 is a schematic top view along a line A-A' in FIG. 1 in accordance with some embodiments of the present disclosure.

FIG. 2 is a schematic top view along a line A-A' in FIG. 1 in accordance with some embodiments of the present disclosure. In some embodiments, the inner gate layer 212 is encircled by the inner dielectric layer 222. In some embodiments, the inner dielectric layer 222 is encircled by the channel layer 23. In some embodiments, the channel layer 23 is encircled by the outer dielectric layer 221. In some embodiments, the outer dielectric layer 221 is encircled by the outer gate layer 211. Configurations of the gate layers 211 and 212, the channel layer 23, and the dielectric layers 221 and 222 are not limited to those shown in the figures and may vary according to patterning operations performed during processing. In some embodiments, the inner gate layer 212, the channel layer 23, and the dielectric layers 221 and 222 are all in circular configurations as shown in FIG. 2.

Figure 3:
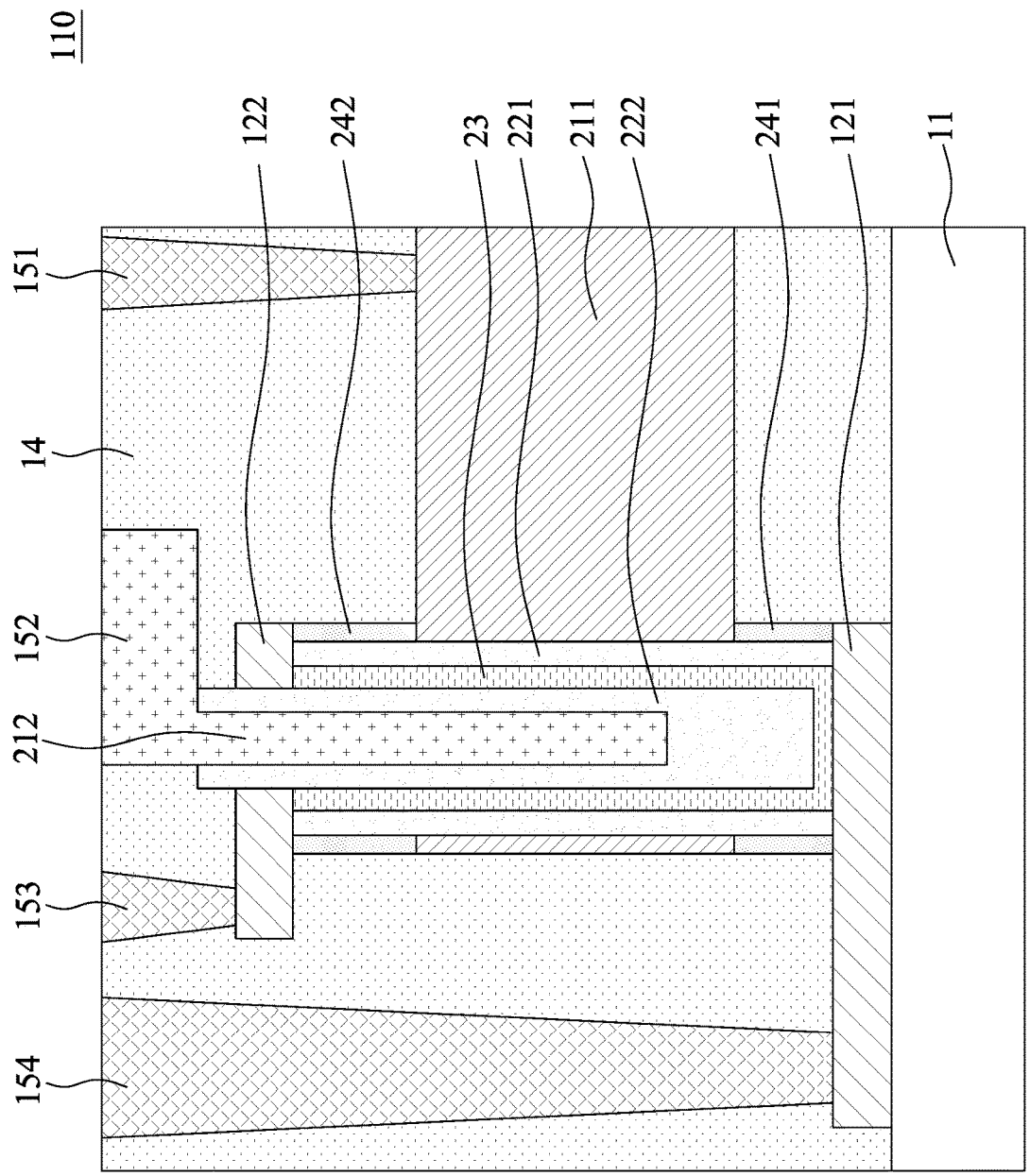
FIG. 3 is a schematic cross-sectional diagram of a semiconductor structure in accordance with some embodiments of the present disclosure.

FIG. 3 is a schematic cross-sectional diagram of a semiconductor structure 110 in accordance with some embodiments of the present disclosure. The semiconductor structure 110 may include a GAA structure similar to one of the GAA structures of the semiconductor structure 100 and may further include multiple contacts 15 for electrical connections to other electrical components. In some embodiments, the GAA structure of the semiconductor structure 110 is surrounded by an isolation structure 14, which may be similar to the isolation structure 14 of the semiconductor structure 100 shown in FIG. 1. The isolation structure 14 can be a multi-layer structure and may include trench isolations like the trench isolations 141 shown in FIG. 1. Details of the isolation structure 14 are omitted in FIG. 3 for a purpose of simplicity and ease of understanding.

In some embodiments, the semiconductor structure 110 includes the plurality of contacts 15. In some embodiments, the plurality of contacts 15 include a first contact 151, a second contact 152, a third contact 153 and a fourth contact 154. In some embodiments, the contacts 151, 152, 153 and 154 are electrically isolated from each other.

In some embodiments, the first contact 151 penetrates a portion of the isolation structure 14 to electrically connect to the outer gate layer 211. In some embodiments, for a purpose of electrical connection, the outer gate layer 211 extends along a second direction (e.g., X direction) farther from the outer dielectric layer 221 than the spacer structures 24 or the doped structures 12. In some embodiments, the first contact 151 contacts a portion of the outer gate layer 211 exposed through the second doped structure 122 from a top view. In some embodiments, for a purpose of electrical connection, the second contact 152 penetrates a portion of the isolation structure 14 over the inner gate layer 212. In some embodiments, the second contact 152 contacts a top surface of the inner gate layer 212.

In some embodiments, the first doped structure 121 and the second doped structure 122 respectively extend from a bottom and a top of the spacer structure 24 along a horizontal direction (e.g., X direction or Y direction). In some embodiments, the first doped structure 121 and the second doped structure 122 both extend along a direction opposite to the second direction (i.e., opposite to the direction of the extension of the outer gate layer 211). In some embodiments, the first doped structure 121 extends farther than the extension of the second doped structure 122. In some embodiments, the fourth contact 154 contacts a portion of the first doped structure 121 outside an overlapping area of the gate structure 20. In some embodiments, the third contact 153 contacts a portion of the first doped structure 121 outside an overlapping area of the second doped structure 122 and the gate structure 20.

Referring back to FIG. 1, it should be noted that FIG. 1 shows only a portion of the semiconductor structure 100 formed over the substrate 11. Other regions or portions of the substrate may include other semiconductor devices, electrical components, electrical elements or a combination thereof. In some embodiments, those devices or components include transistors or functional units of transistors. In some embodiments, the devices or components include active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., system-on-a-chip (SoC), a central processing unit (CPU), a graphics processing unit (GPU), an application processor (AP), a microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. Each of the active components may include multiple transistors. The transistors can include planar transistors, multi-gate transistors, gate-all-around field-effect transistors (GAAFET), fin field-effect transistors (FinFET), vertical transistors, nanosheet transistors, nanowire transistors, or a combination thereof. The passive components may include a capacitor, a resistor, an inductor, a fuse or other passive components. The conductive elements may include metal lines, metal islands, conductive vias, contacts or other conductive elements. The active components, passive components, and/or conductive elements as mentioned above can be formed in and/or over a semiconductor substrate. The devices, components or elements as mentioned above can be formed at a same elevation as the GAA structures shown in FIG. 1 or at elevations different from those of the GAA structures shown in FIG. 1. For instance, memory components (e.g., DRAM and SRAM) can be formed vertically over the GAA structures shown in FIG. 1.

A manufacturing method of a vertical FET involves multiple annealing operations, and variation of a threshold voltage of a conventional vertical FET occurs due to channel shortening by high-temperature processing of the annealing operations, especially when the conventional vertical FET includes IGZO as a channel material. An issue of critical variation of a threshold voltage of a vertical FET can arise (e.g., when a threshold voltage is shifted to a value outside a variation tolerance), thus affecting a product yield. For instance, a threshold voltage of an N-type FET may shift to a negative value, resulting in failure of the N-type FET.

The vertical GAA structure of the present disclosure includes at least two gate electrodes (e.g., the gate layers 211 and 212). For instance, the vertical GAA structure as illustrated above includes an inner gate and an outer gate. The inner gate can be used to adjust a threshold voltage of the vertical GAA structure to avoid a negative value of the threshold voltage. In some embodiments, the inner gate layer 212 and the outer gate layer 211 can be provided with different voltage biases through different contacts (e.g., the contacts 151 and 152). Therefore, annealing operations of a conventional manufacturing method can be applied in manufacturing the vertical GAA structure of the present disclosure, and the issue of critical variation of a threshold voltage of a vertical GAA structure can be avoided. A product yield can be thereby improved.

Figure 4:
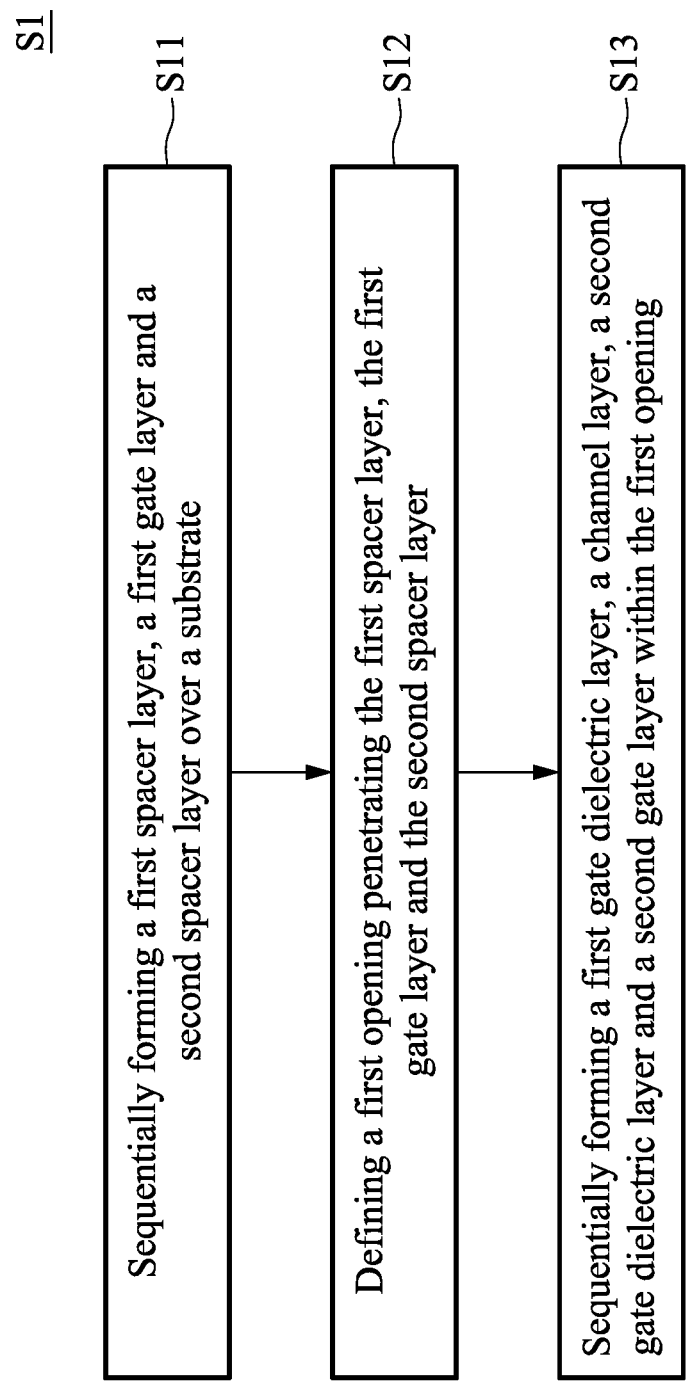
FIG. 4 is a flow diagram illustrating a method for manufacturing a semiconductor structure in accordance with some embodiments of the present disclosure.

FIG. 4 is a flow diagram illustrating a method S1 for manufacturing a semiconductor structure in accordance with some embodiments of the present disclosure. The method S1 includes a number of operations (S11, S12 and S13) and the description and illustration are not deemed as a limitation to the sequence of the operations. In the operation S11, a first spacer layer, a first gate layer and a second spacer layer are sequentially formed over a substrate. In the operation S12, a first opening is defined, wherein the first opening penetrates the first spacer layer, the first gate layer and the second spacer layer. In the operation S13, a first gate dielectric layer, a channel layer, a second gate dielectric layer and a second gate layer are sequentially formed within the first opening. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

FIGS. 5 to 19 are schematic cross-sectional diagrams at different stages of the method S1 in accordance with some embodiments of the present disclosure.

Figure 5:
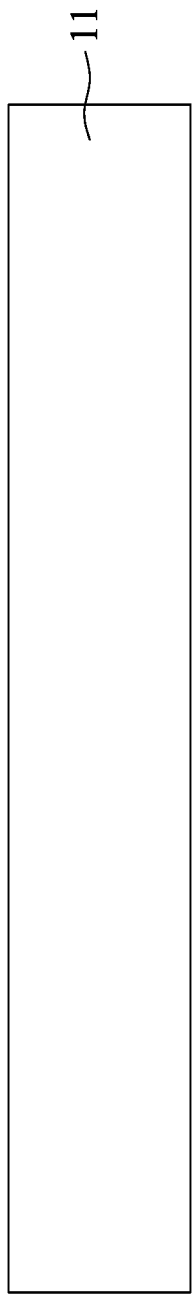
FIGS. 5 to 19 are schematic cross-sectional diagrams at different stages of the method S1 in accordance with some embodiments of the present disclosure.

Referring to FIG. 5, a substrate 11 is provided prior to the operation S11 of the method S1. In some embodiments, the substrate 11 may be a bulk semiconductor, a semiconductor-on-insulator (SOI) substrate, or the like. The substrate 11 may be of a first conductivity type, e.g., a P-type semiconductive substrate (acceptor type), or of a second conductivity type, e.g., an N-type semiconductive substrate (donor type). In some embodiments, the substrate 11 may include a doped epitaxial layer, a gradient semiconductor layer, or a semiconductor layer overlaying another semiconductor layer of a different type, such as a silicon layer on a silicon germanium layer.

Alternatively, the substrate 11 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor material may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 11 may have a multilayer structure, or the substrate 11 may include a multilayer compound semiconductor structure.

Figure 6:
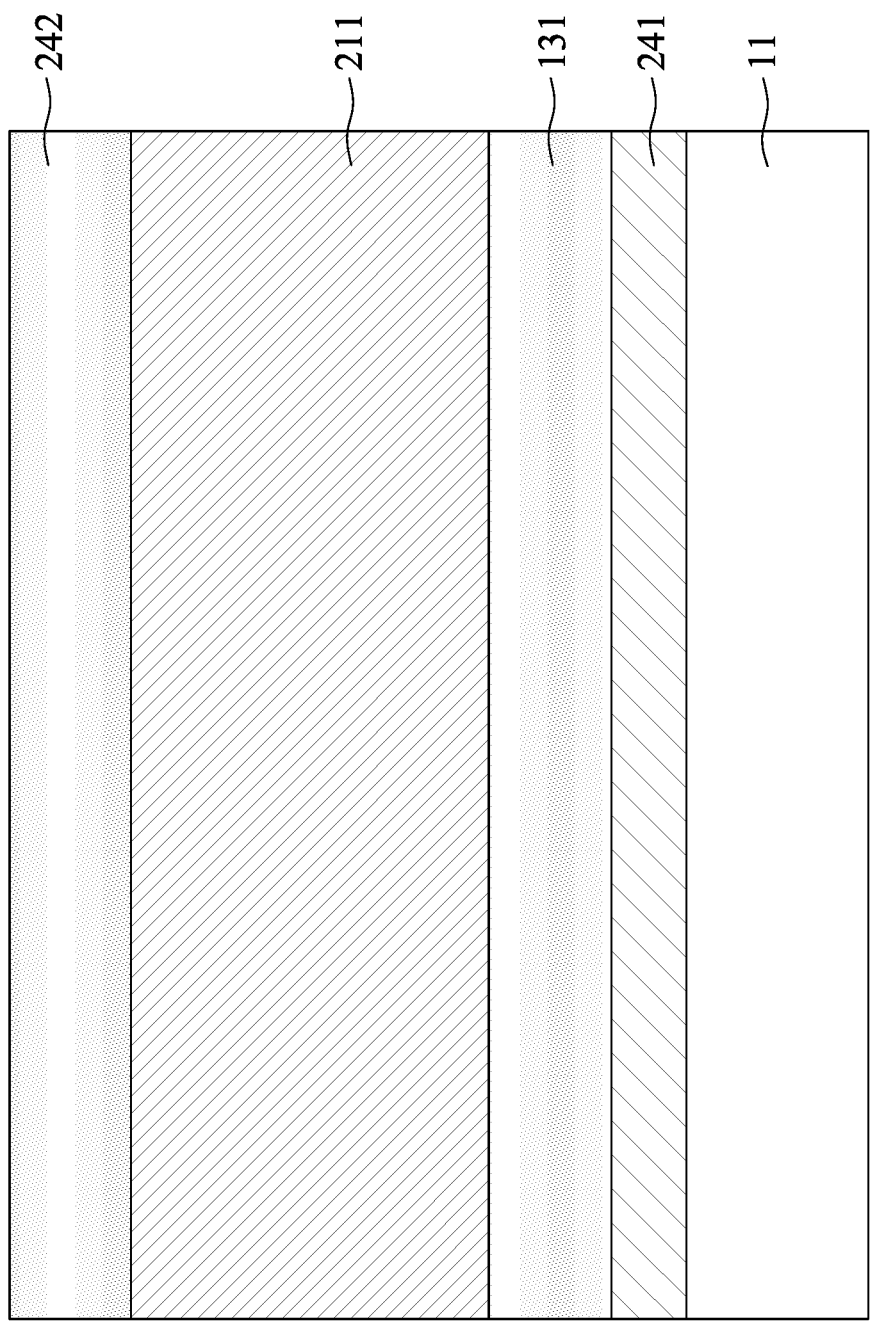

Referring to FIG. 6, a first spacer layer 241, an outer gate layer 211 and a second spacer layer 242 are sequentially formed over the substrate 11 in the operation S12. The method S1 may further includes formation of a first doped structure 121 prior to the formation of the first spacer layer 241.

In some embodiments, the first doped structure 121 includes a semiconductive material. In some embodiments, the semiconductive material of the first doped structure 121 can be one of the materials of the substrate 11 listed above. In some embodiments, the first doped structure 121 includes a semiconductive material different from that of the substrate 11. In some embodiments, a thickness of the first doped structure 121 is in a range of 50 to 500 nm. In some embodiments, the first doped structure 121 is formed by a deposition. In some embodiments, dopants of an N-type conductivity or a P-type conductivity are provided during the deposition. In some embodiments, the dopants are provided after the deposition by implantation. In some embodiments, the first doped structure 121 includes dopants different from that of the substrate 11. In some embodiments, the deposition includes a blanket deposition, and the first doped structure 121 is formed across an entirety of the substrate 11. In some embodiments, the deposition includes chemical vapor deposition (CVD), atomic layer deposition (ALD), plasma-enhanced chemical vapor deposition (PECVD), plasma-enhanced atomic layer deposition (PEALD) or a combination thereof. In some embodiments, a patterning operation is performed on the first doped structure 121 after the deposition to form a desired pattern of the first doped structure 121 (e.g., the first doped structure 121 shown in FIG. 3) for a purpose of electrical connection and electrical properties.

The first spacer layer 241 may include one or more suitable dielectric materials. In some embodiments, the dielectric material includes silicon oxide ($SiO_x$), silicon nitride ($Si_xN_y$), silicon oxynitride (SiON), or a combination thereof. In some embodiments, the dielectric material includes a high-k dielectric material. The high-k dielectric material may have a dielectric constant (k value) greater than 4. The high-k dielectric materials may include zirconium dioxide ($ZrO_2$), hafnium oxide ($HfO_2$), aluminum oxide ($Al_2O_3$), yttrium oxide ($Y_2O_3$), lanthanum oxide ($La_2O_3$), silicates of one or more of $ZrO_2$, $HfO_2$, $Al_2O_3$, $Y_2O_3$ and $La_2O_3$, aluminates of one or more of $ZrO_2$, $HfO_2$, $Y_2O_3$ and $La_2O_3$, tantalum oxide ($Ta_2O_5$), barium titanate ($BaTiO_3$), titanium dioxide ($TiO_2$), cerium oxide ($CeO_2$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), PST ($PbSc_xTa_{1-x}O_3$), hafnium zirconium oxide ($Hf_xZr_yO_z$), hafnium zirconium aluminum oxide ($Hf_wZr_xAl_yO_z$), lithium oxide ($Li_2O$), hafnium silicon oxide ($HfSiO_4$), strontium oxide (SrO), scandium oxide ($Sc_2O_3$), molybdenum trioxide ($MoO_3$), barium oxide (BaO), or a combination thereof. Other suitable materials are within the contemplated scope of this disclosure.

In some embodiments, the first spacer layer 241 is formed by a deposition. In some embodiments, the deposition includes a blanket deposition, and the first spacer layer 241 is formed across an entirety of the substrate 11. In some embodiments, the deposition includes CVD, ALD, PECVD, PEALD or a combination thereof. In some embodiments, a thickness of the first spacer layer 241 is in a range of 5 to 30 nm.

In some embodiments, the outer gate layer 211 is formed by a deposition. In some embodiments, the deposition includes a blanket deposition, and the outer gate layer 211 is formed across an entirety of the substrate 11. In some embodiments, the deposition includes CVD, ALD, PECVD, PEALD or a combination thereof. In some embodiments, a thickness of the outer gate layer 211 is in a range of 20 to 200 nm. In some embodiments, the outer gate layer 211 includes one or more gate materials. In some embodiments, the gate material includes aluminum (Al), copper (Cu), tungsten (W), titanium (Ti), tantalum (Ta), tantalum aluminum (TaAl), tantalum aluminum nitride (TaAlN), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), other suitable materials, alloys thereof, or combinations thereof.

A material and a forming method of the second spacer layer 242 can be similar to those of the first spacer layer 241, and repeated description is omitted herein. In some embodiments, a thickness of the second spacer layer 242 can be substantially equal to the thickness of the first spacer layer 241.

Figure 7:
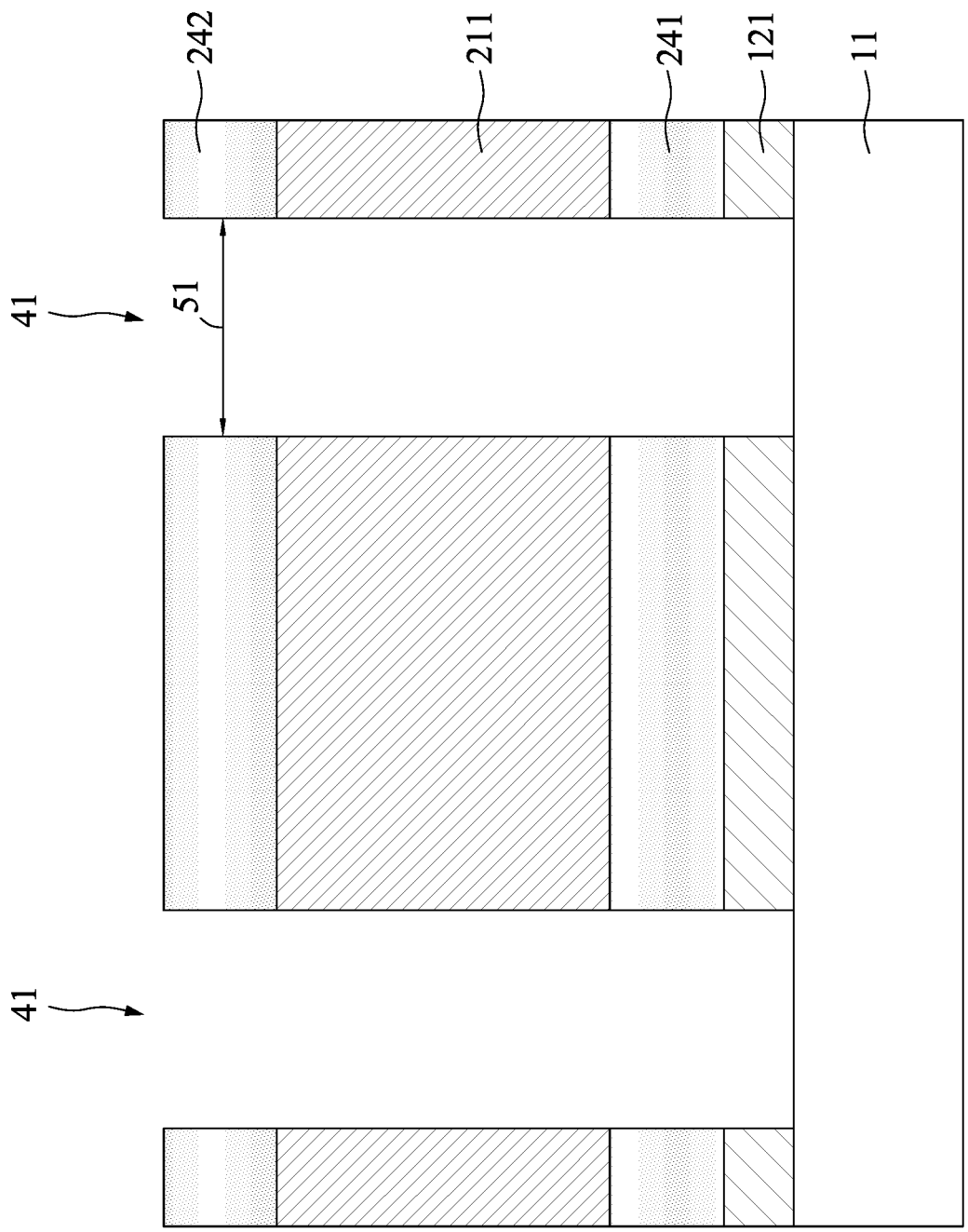

Referring to FIG. 7, in the operation S12, at least one opening 41 is defined penetrating the second spacer layer 242, the outer gate layer 211, the first spacer layer 241, and the first doped structure 121. A number of the openings 41 is not limited herein and depends on a number of gate electrodes to be formed. The operation S12 can include multiple steps.

One or more patterning operations are performed on the second spacer layer 242, the outer gate layer 211, the first spacer layer 241, and the first doped structure 121. In some embodiments, portions of the second spacer layer 242, the outer gate layer 211, the first spacer layer 241, and the first doped structure 121 are concurrently removed by one or more etching operations using a same mask (not shown) to form the openings 41 having straight sidewalls as shown in FIG. 7. In some embodiments, multiple etching operations are performed to form the openings 41 due to etching selectivity of different materials.

The second spacer layer 242, the outer gate layer 211, the first spacer layer 241, and the first doped structure 121 may have different patterns as shown in FIG. 3. In some embodiments, patterning operations can be performed respectively on the second spacer layer 242, the outer gate layer 211, the first spacer layer 241, and the first doped structure 121 to achieve desired patterns of the second spacer layer 242, the outer gate layer 211, the first spacer layer 241, and the first doped structure 121 for a purpose of electrical connections or desired electrical properties. The openings 41 can be formed after formations of the patterns of the second spacer layer 242, the outer gate layer 211, the first spacer layer 241, and the first doped structure 121. In some embodiments, a width 51 of the opening 41 is in a range of 19 to 90 nm.

FIGS. 8 to 19 are schematic cross-sectional diagrams at different stages of the operation S13 of the method S1 in accordance with some embodiments of the present disclosure.

Figure 8:
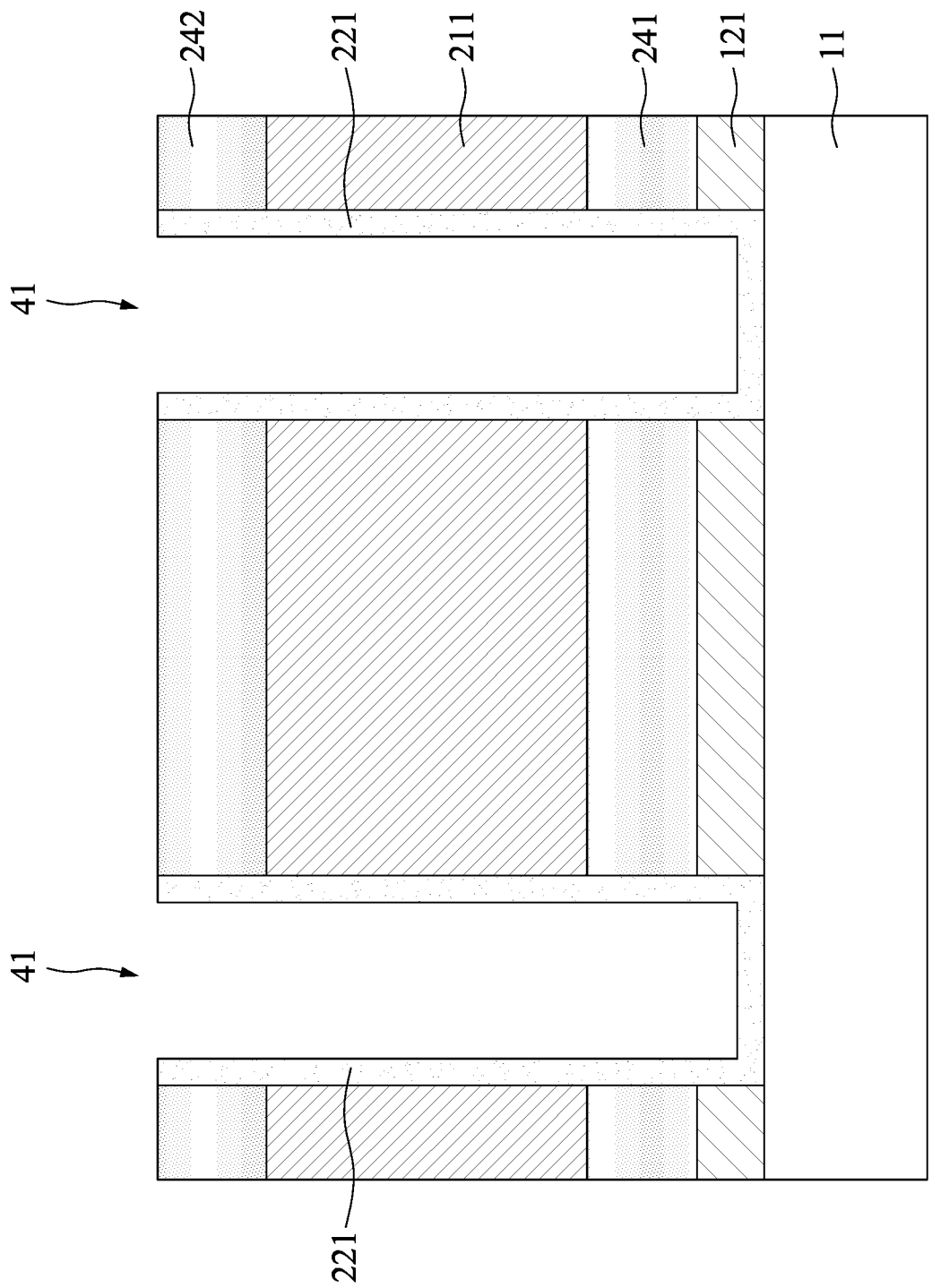

Referring to FIG. 8, an outer dielectric layer 221 is formed lining the openings 41. In some embodiments, the outer dielectric layer 221 is formed by a deposition. In some embodiments, the deposition includes a conformal deposition. In some embodiments, the deposition includes CVD, ALD, PECVD, PEALD or a combination thereof. In some embodiments, a thickness of the outer dielectric layer 221 is in a range of 2 to 5 nm. In some embodiments, a mask layer (not shown) used in the definition of the openings 41 in the operation S12 remains over a top surface of the second spacer layer 242, and the outer dielectric layer 221 is formed only in the openings 41. In some embodiments, the outer dielectric layer 221 is also formed over the top surface of the second spacer layer 242 (not shown).

Figure 9:
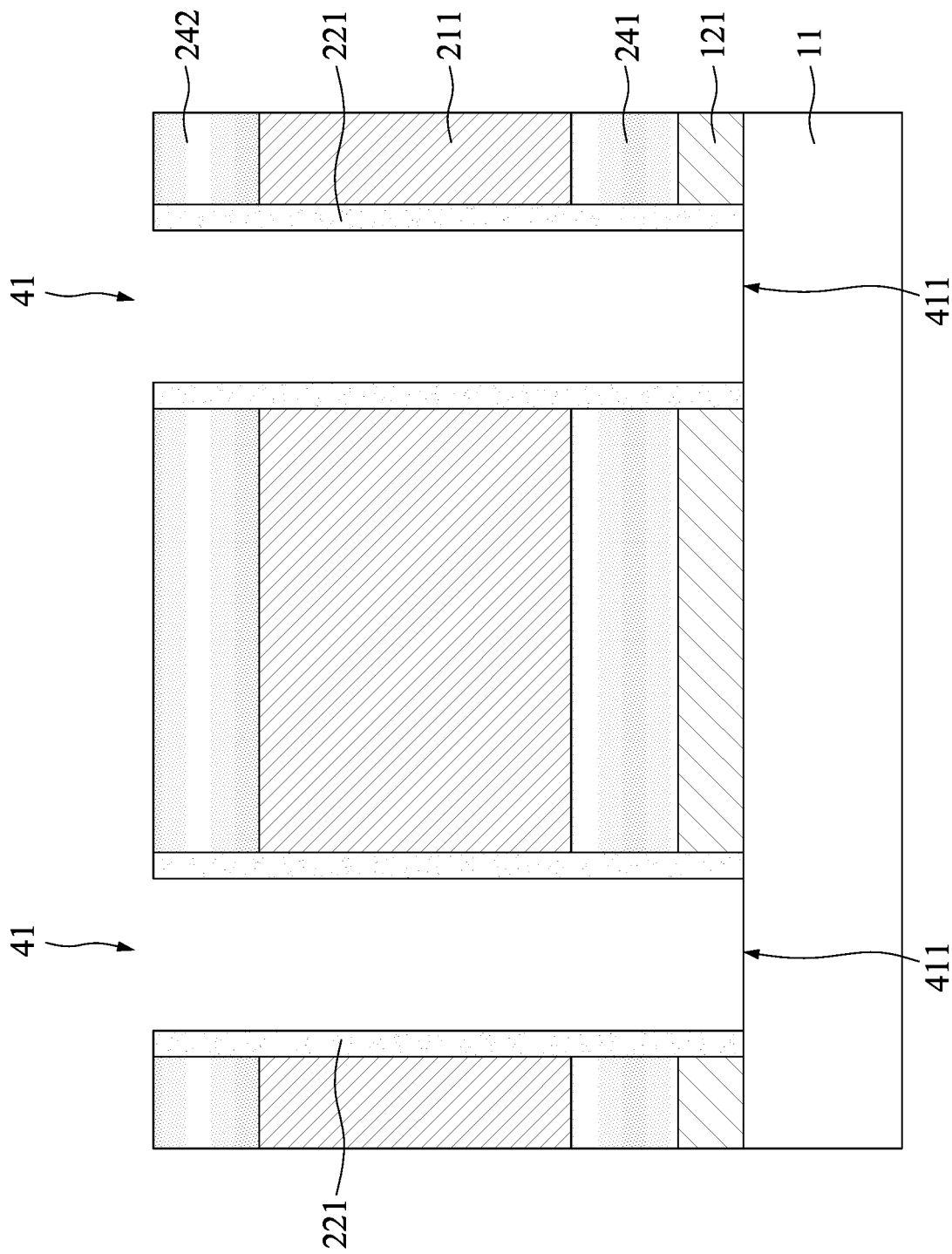

Referring to FIG. 9, horizontal portions (or bottom portions) of the outer dielectric layer 221 at bottoms 411 of the openings 41 are removed. In some embodiments, an etching operation is performed after the deposition to expose portions of the substrate 11 in the openings 41 respectively. In some embodiments, a directional plasma etching is performed to remove the horizontal portions of the outer dielectric layer 221. In some embodiments, the outer dielectric layer 221 is referred to as a gate oxide layer 221.

Alternative to the operations as depicted in FIGS. 8 to 9, the outer dielectric layer 221 can firstly fill the openings 41, and then portions of the outer dielectric layer 221 are removed by a patterning operation to form the outer dielectric layer 221 as shown in FIG. 9.

Figure 10:
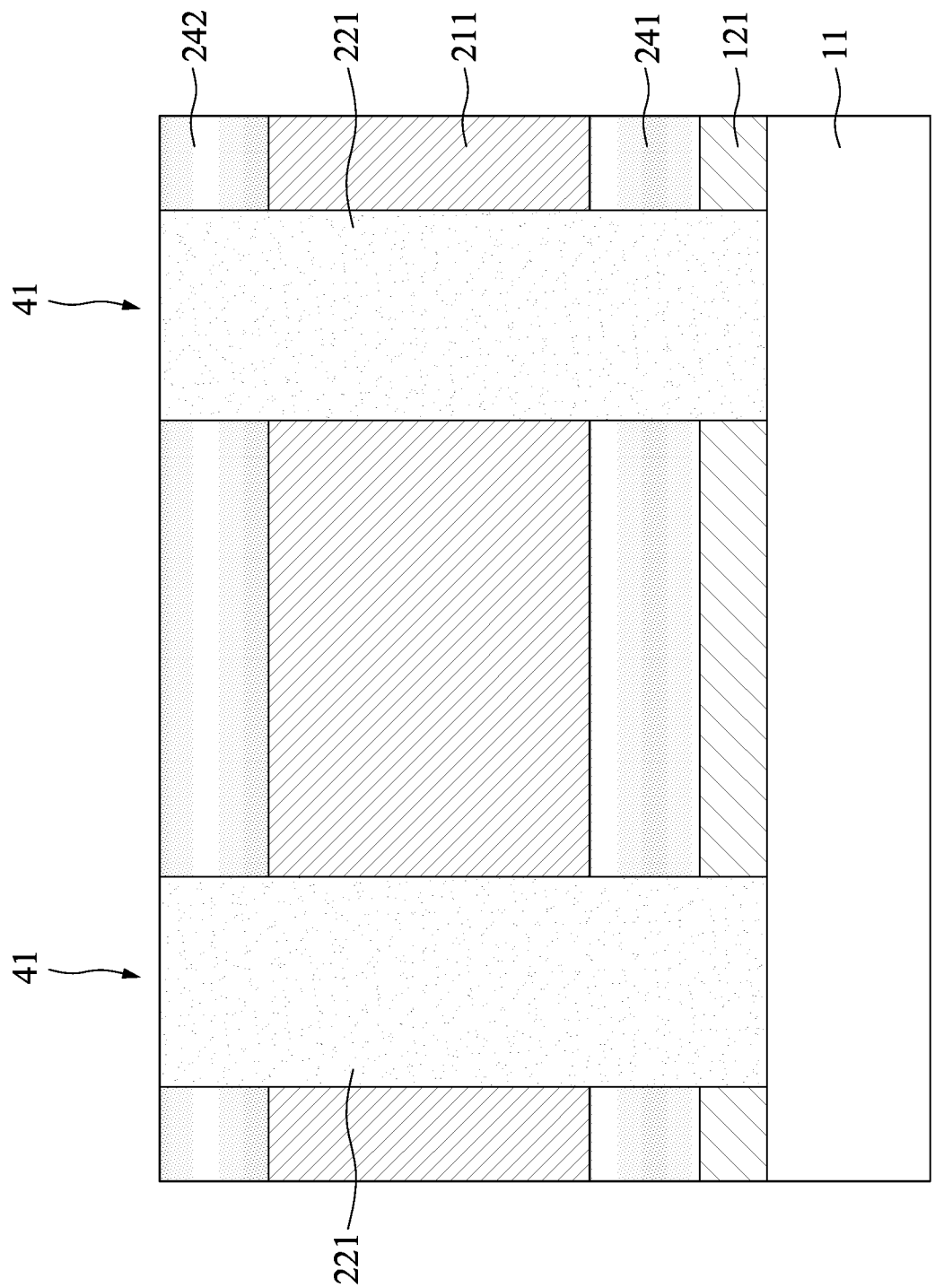

Referring to FIG. 10, an outer dielectric layer 221 fills the openings 41 after the operations as depicted in FIG. 7. In some embodiments, the outer dielectric layer 221 includes oxide. In some embodiments, the outer dielectric layer 221 can be formed by a deposition, e.g., CVD, to fill the openings 41.

Figure 11:
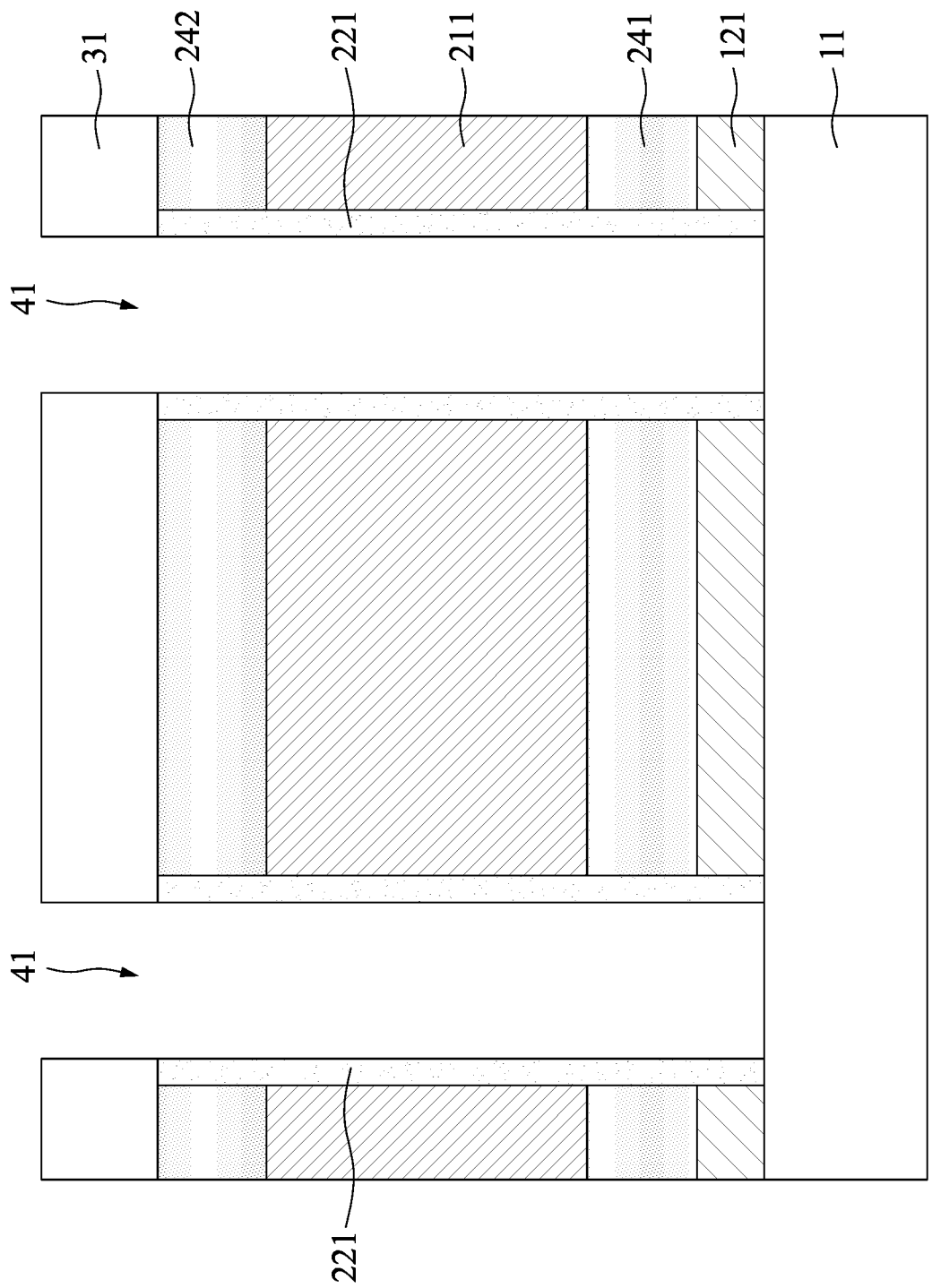

Referring to FIG. 11, a photoresist layer 31 is formed over the second spacer layer 242 and the outer dielectric layer 221. In some embodiments, photoresist application (e.g., formation of a layer of photoresist material), exposure and developing are sequentially performed to form the photoresist layer 31. The photoresist layer 31 serves to define the outer dielectric layer 221 as shown in FIG. 11. The photoresist layer 31 covers portions of the outer dielectric layer 221 and exposes central portions of the outer dielectric layer 221 in the openings 41. In some embodiments, an etching operation is performed to remove the central portions of the outer dielectric layer 221 exposed through the photoresist layer 31. The outer dielectric layer 221 is thereby formed, and the photoresist layer 31 is removed after the formation of the outer dielectric layer 221. In some embodiments, the photoresist layer 31 is replaced by a hard layer (e.g., a dielectric material having an etching selectivity to the outer dielectric layer 221) to achieve a same manufacturing result.

Figure 12:
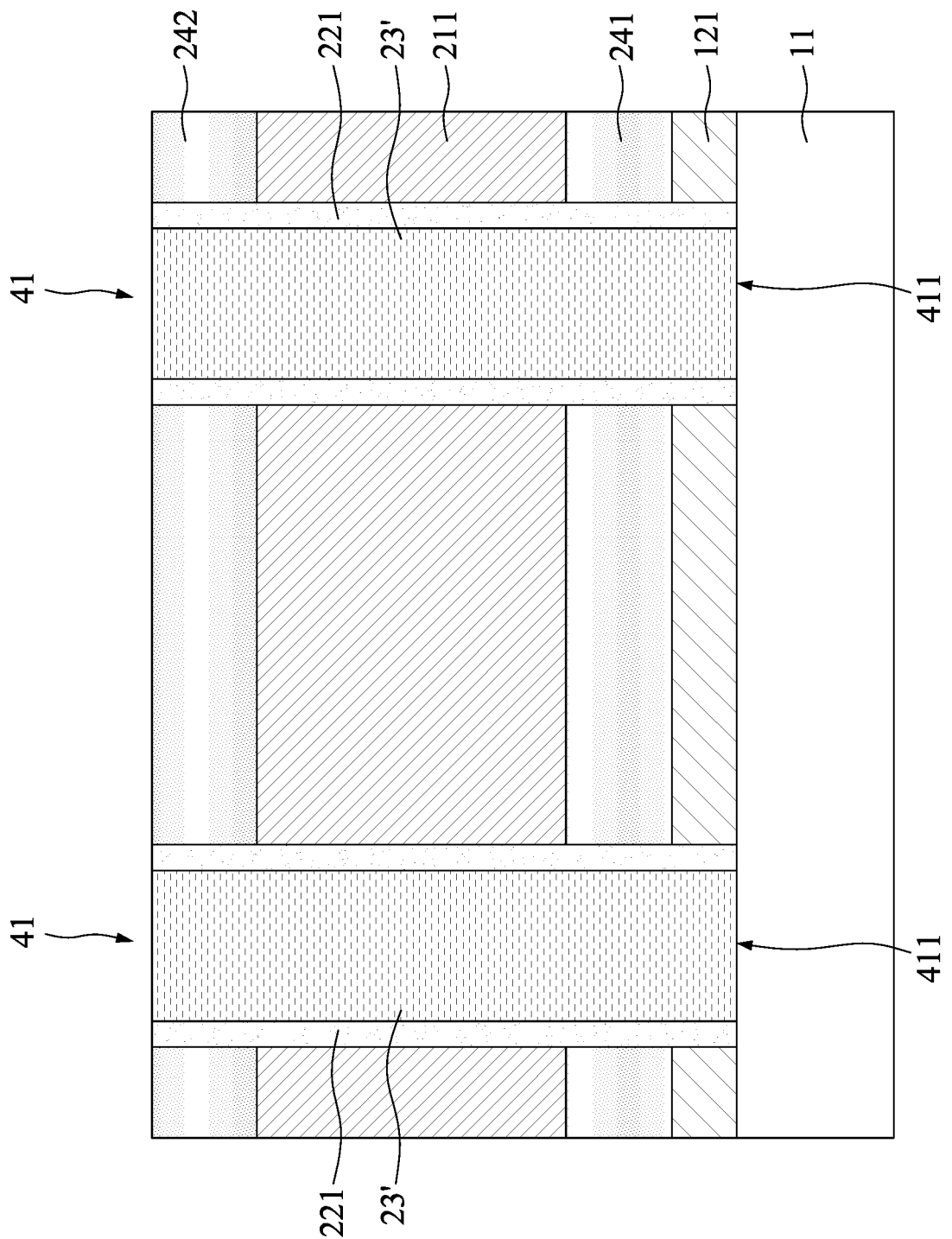

Referring to FIG. 12, a channel material 23' is formed and fills the space remaining in the opening 41 after the formation of the outer dielectric layer 221. In some embodiments, the channel material 23' contacts bottoms 411 of the openings 41. In some embodiments, a deposition followed by a planarization is performed. In some embodiments, the planarization includes a chemical mechanical polishing (CMP), a time-mode etching operation, or a combination thereof. In some embodiments, a top surface of the channel material 23' is substantially aligned with or coplanar with a top surface of the second spacer layer 242. In some embodiments, the top surface of the channel material 23' is substantially aligned with or coplanar with a top surface of the outer dielectric layer 221.

Figure 13:
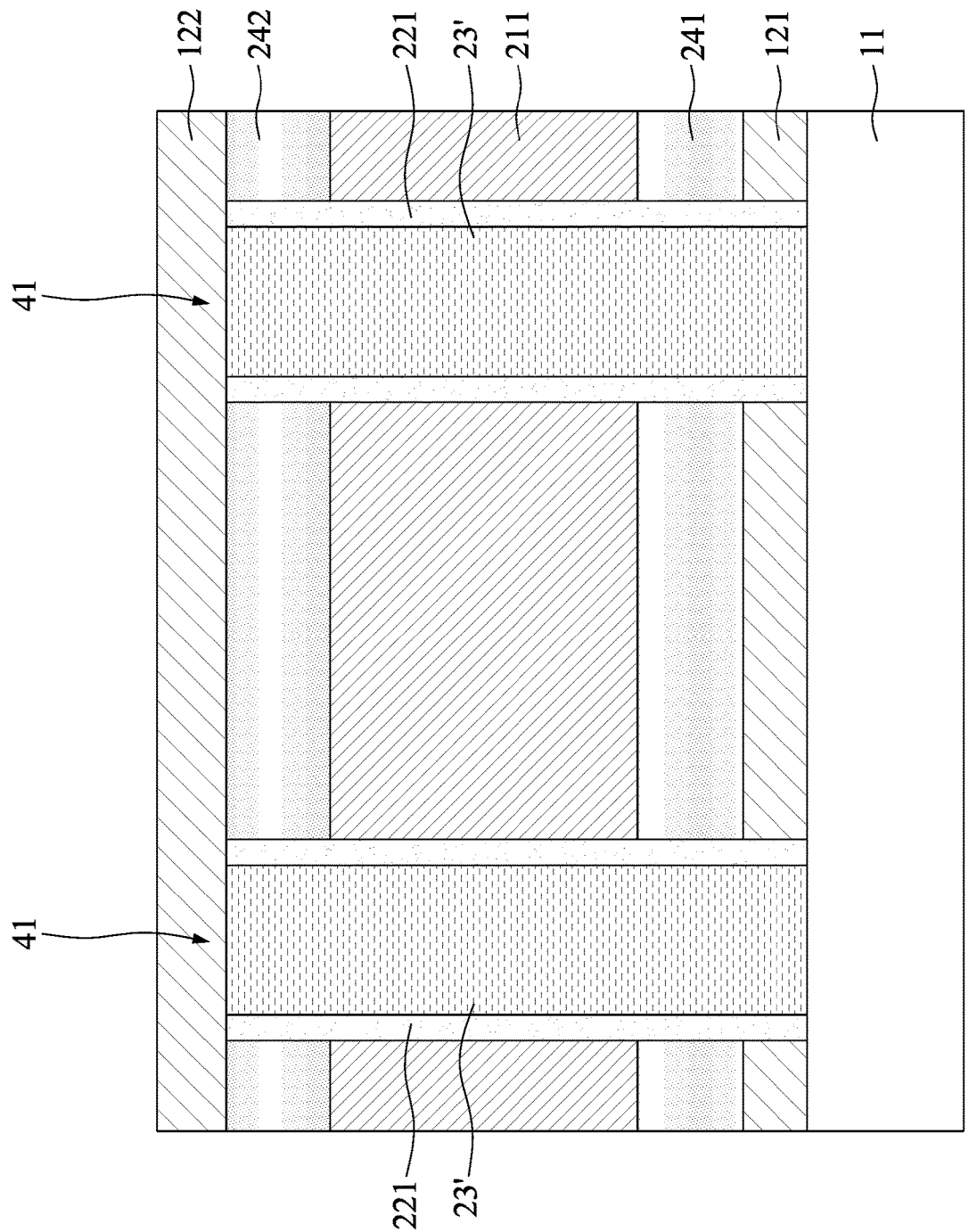

Referring to FIG. 13, a second doped structure 122 is formed over the second spacer layer 242. In some embodiments, the formation of the second doped structure 122 is similar to the formation of the first doped structure 121. In some embodiments, the second doped structure 122 has a conductivity type same as that of the first doped structure 121. In some embodiments, a thickness of the second doped structure 122 is in a range of 50 to 500 nm.

Figure 14:
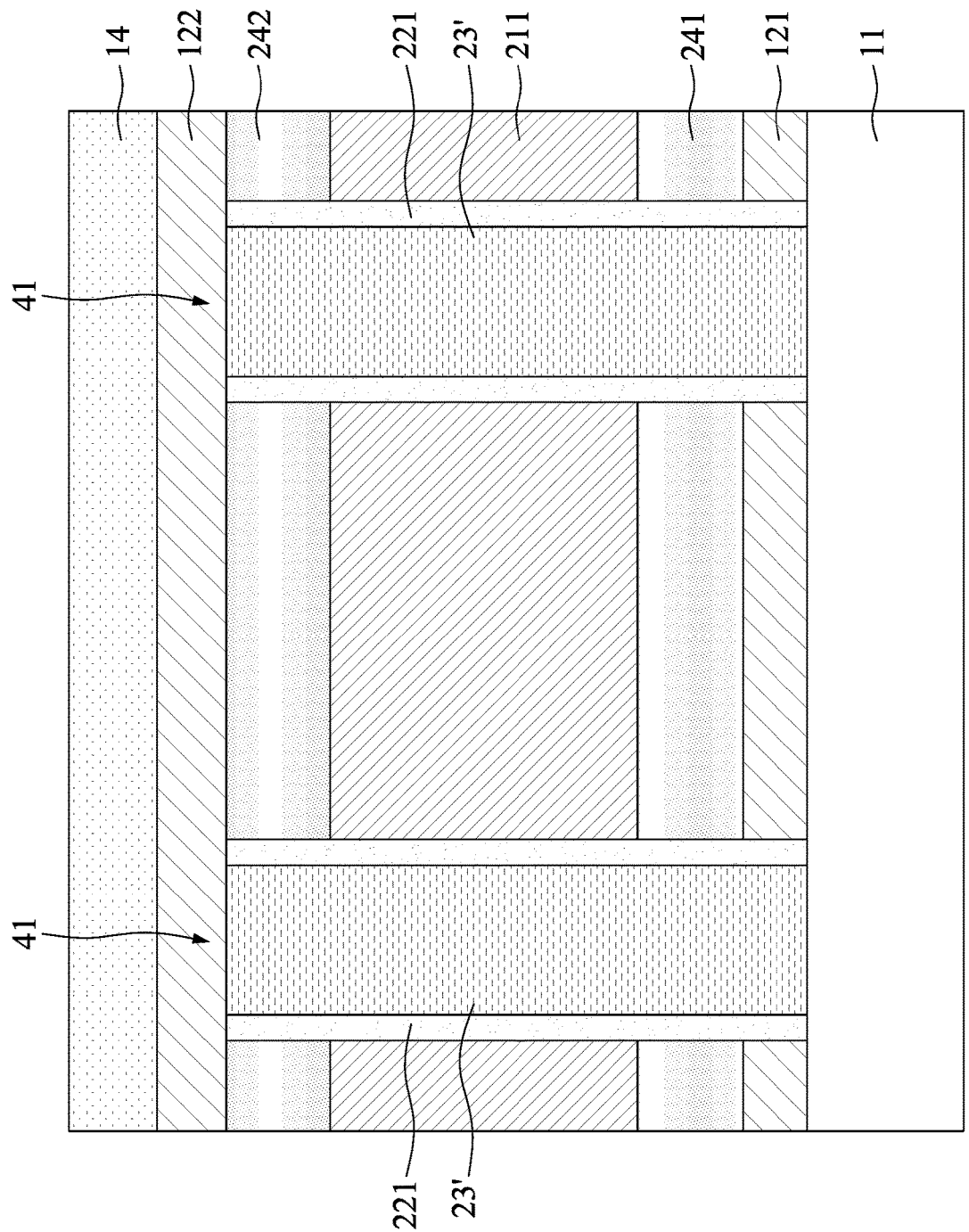

Referring to FIG. 14, an isolation structure 14 is formed over the second doped structure 122. In some embodiments, the isolation structure 14 is a layer of dielectric material. In some embodiments, the isolation structure 14 extends toward the substrate 11 and between the outer dielectric layer 221 in adjacent openings 41 (e.g., similar to the trench isolations 141 shown in FIG. 1). In some embodiments, the isolation structure 14 may be formed by one or more depositions.

Figure 15:
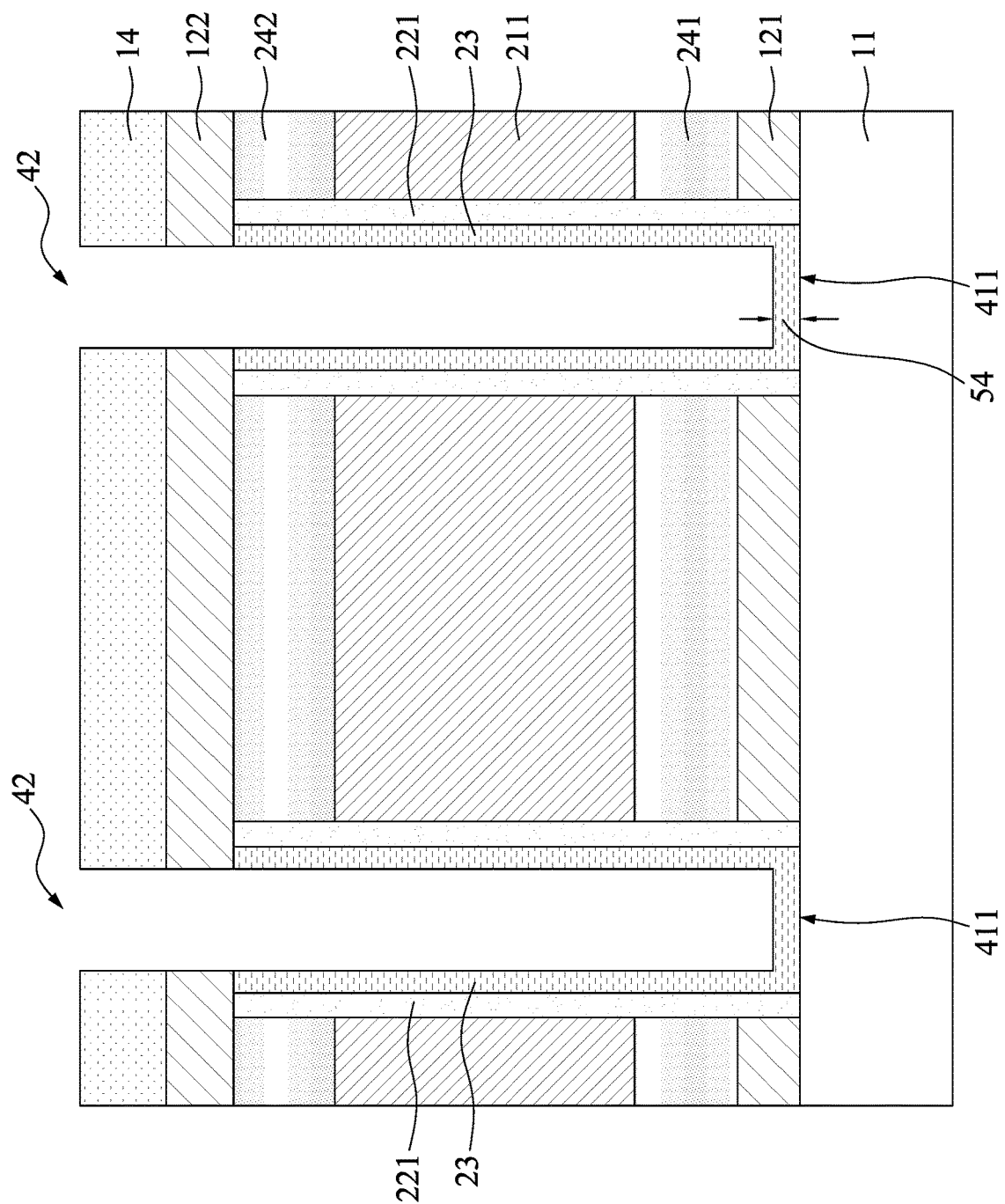

Referring to FIG. 15, one or more openings 42 are formed within a coverage area of the opening(s) 41. In some embodiments, a photoresist layer or a hard layer is formed over the isolation structure 14 to define positions and configurations of the openings 42. In some embodiments, one or more etching operations are performed to remove portions of the isolation structure 14, the second doped structure 122, and the channel material 23' (shown in FIG. 14) to form the opening 42, and a channel layer 23 is thereby formed. The channel layer 23 lines the outer dielectric layer 221 and the substrate 11. In some embodiments, the etching operation(s) is stopped above the substrate 11 by a distance 54 within the channel material 23'. In some embodiments, the channel layer 23 contacts the bottoms 411 of the openings 41. In some embodiments, the distance 54 is in a range of 2 to 10 nm. In some embodiments, the channel layer 23 is controlled to have a consistent thickness in a range of 2 to 10 nm. In other words, a thickness of the channel layer 23 at sidewalls of the opening 42 is substantially equal to a thickness of the channel layer 23 at a bottom of the opening 42.

Figure 16:
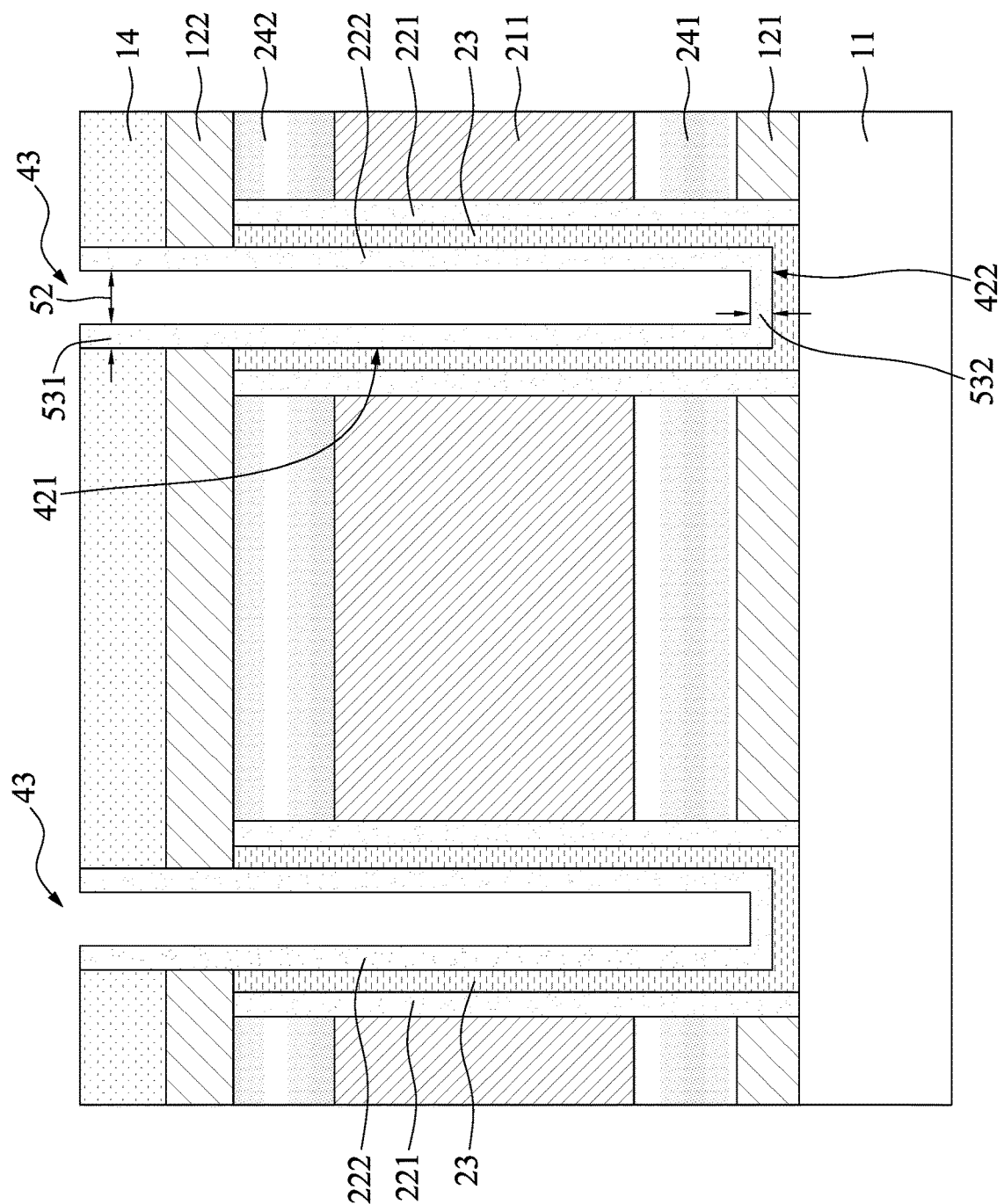

Referring to FIG. 16, an inner dielectric layer 222 is formed lining the openings 42 shown in FIG. 15. In some embodiments, a conformal deposition (e.g., ALD) is performed to form the inner dielectric layer 222. In some embodiments, a thickness of the inner dielectric layer 222 is in a range of 3 to 5 nm. In some embodiments, the inner dielectric layer 222 has a consistent thickness. In other words, a thickness 531 of the inner dielectric layer 222 at a sidewall 421 of the opening 42 (i.e., along a sidewall of the channel layer 23) is substantially equal to a thickness 532 of the inner dielectric layer 222 at a bottom 422 of the opening 42 (i.e., along a bottom of the channel layer 23). At least one opening 43 is defined by the inner dielectric layer 222. In some embodiments, a width 52 of the opening 43 is in a range of 5 to 50 nm.

However, the formation of the inner dielectric layer 222 is not limited to the above description. In alternative embodiments, the inner dielectric layer 222 fills the openings 42 and an etching operation is performed to define the openings 43.

Figure 17:
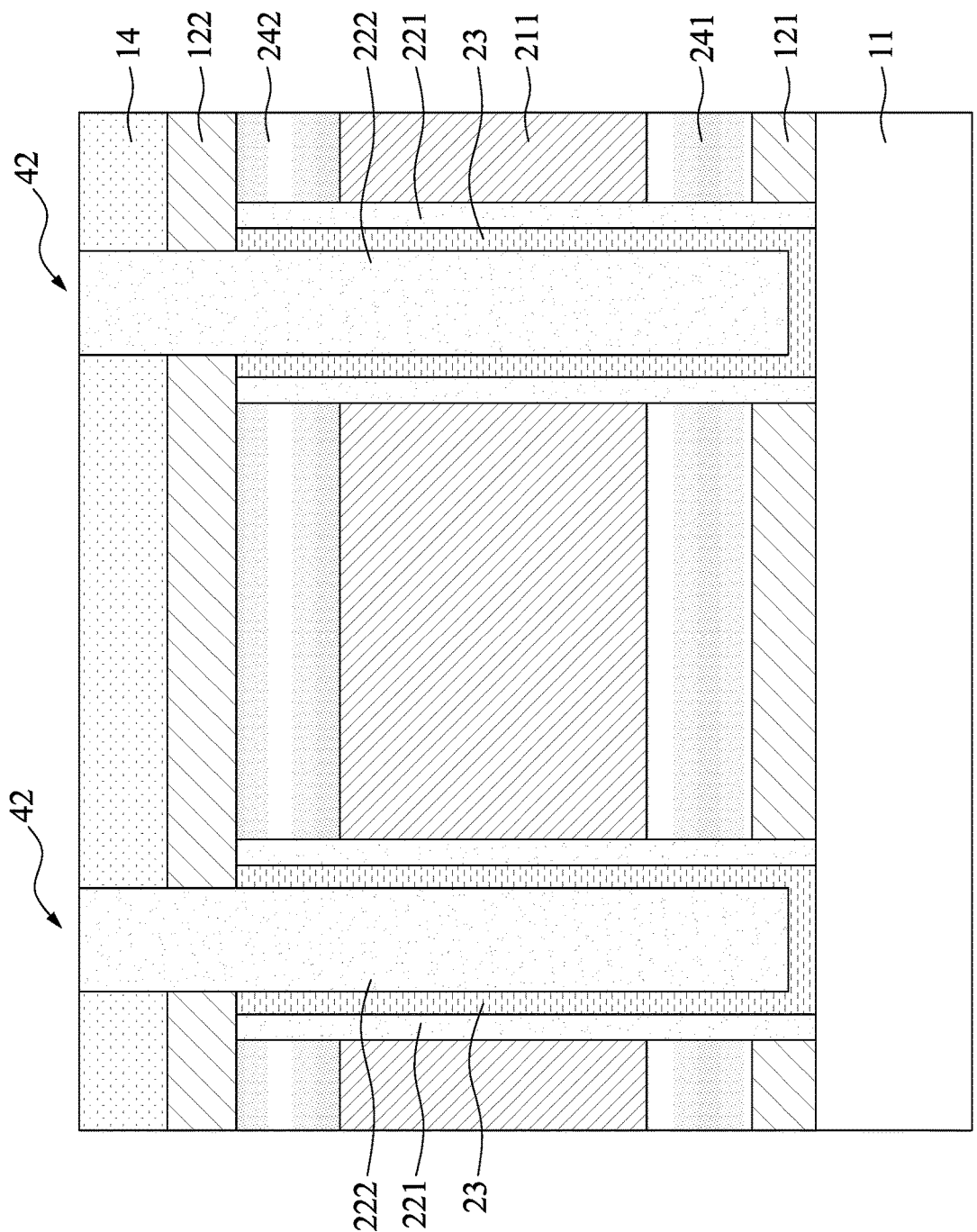

Referring to FIG. 17, after the formation of the openings 42 (e.g., the operations as depicted in FIG. 15), an inner dielectric layer 222 filling the openings 42 is formed. In some embodiments, a deposition followed by a planarization is performed. In some embodiments, the planarization includes CMP, a time-mode etching operation, or a combination thereof. In some embodiments, a top surface of the inner dielectric layer 222 at this stage is substantially aligned with or coplanar with a top surface of the isolation structure 14.

Figure 18:
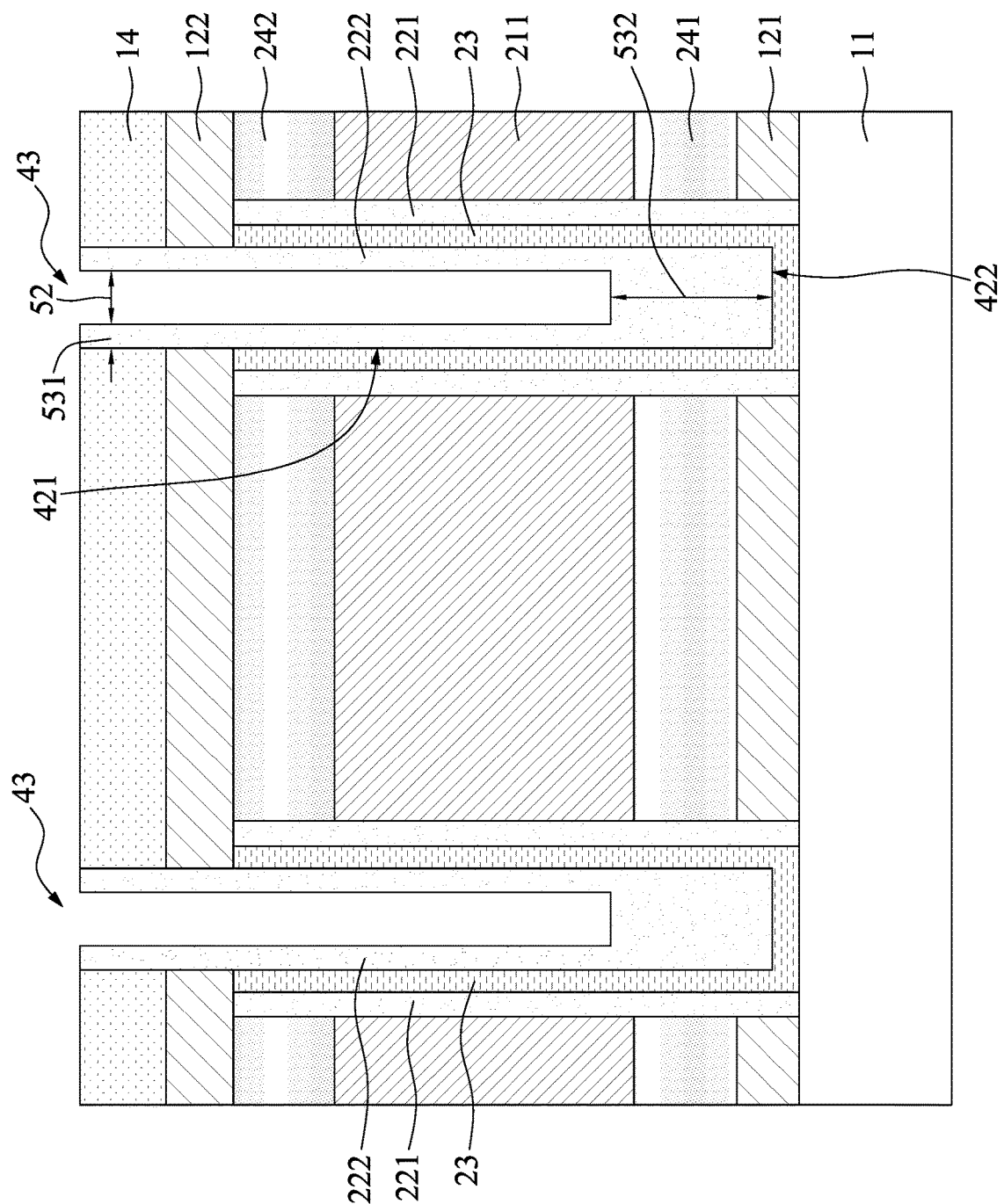

Referring to FIG. 18, a portion of the inner dielectric layer 222 shown in FIG. 17 is removed to form the inner dielectric layer 222 as shown in FIG. 18. In some embodiments, an etching operation is performed on the inner dielectric layer 222 at central regions of the openings 42 shown in FIG. 17. One or more openings 43 are thereby defined by the inner dielectric layer 222. For a purpose of ensuring that the opening 43 does not penetrate the inner dielectric layer 222, the etching operation is stopped within the inner dielectric layer 222, and a thickness 532 at a bottom 422 of the opening 42 (defined by the channel layer as shown in FIG. 7) may not be equal to a thickness 531 at a sidewall of the opening 42. In some embodiments, the thickness 532 of the inner dielectric layer 222 at the bottom 422 of the opening 42 (i.e., along the bottom of the channel layer 23) is substantially greater than the thickness 531 of the inner dielectric layer 222 at the sidewall 421 of the opening 42 (i.e., along the sidewall of the channel layer 23).

Figure 19:
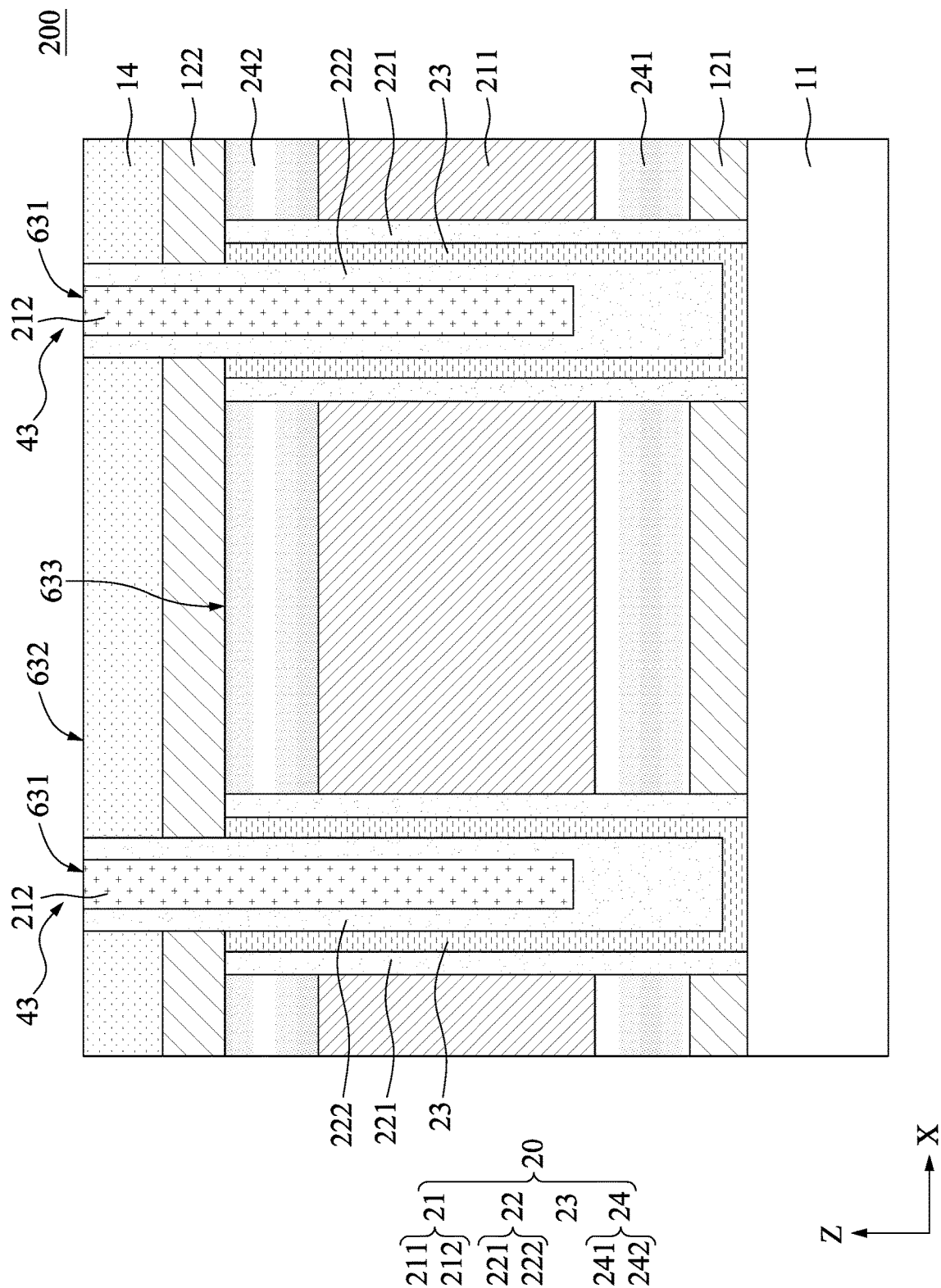

Referring to FIG. 19, an inner gate layer 212 is formed by filling the openings 43. For a purpose of illustration, FIG. 19 shows the formation of the inner gate layer 212 on the intermediate structure of FIG. 18. However, the present disclosure is not limited thereto. The inner gate layer 212 can alternatively be formed on the intermediate structure of FIG. 16, wherein the inner gate layer 212 fills the openings 43 shown in FIG. 16.

In some embodiments, as shown in FIG. 19, the inner gate layer 212 includes at least one material as listed in the selection of materials of the outer gate layer 211 above. A material of the inner gate layer 212 can be same as or different from that of the outer gate layer 211. In some embodiments, the inner gate layer 212 is formed by a deposition followed by an etching operation. In some embodiments, a top surface 631 of the inner gate layer 212 is substantially aligned with or coplanar with a top surface 632 of the isolation structure 14. In some embodiments, the top surface 631 of the inner gate layer 212 is above a top surface 633 of the second doped structure 122. A width of the inner gate layer 212 is defined by the opening 43. In some embodiments, a width of the inner gate layer 212 is in a range of 5 to 50 nm. A semiconductor structure 200 similar to the semiconductor structure 100 is thereby formed, wherein the semiconductor structure includes multiple gate structures 20 electrically connected to each other.

In some embodiments as shown in FIG. 19, a GAA structure of the semiconductor structure 200 includes two gate structures 20. The two gate structures 20 are horizontally adjacent to each other. In some embodiments, the two gate structures 20 have a common outer gate (i.e., the outer gate layer 211) and common source/drain structures (i.e., the first and second doped structures 121 and 122). In some embodiments, each of the two gate structures 20 includes an inner gate (i.e., the inner gate layers 212). In some embodiments, each of the two gate structures 20 includes a channel (i.e., the channel layers 23).

Figure 20:
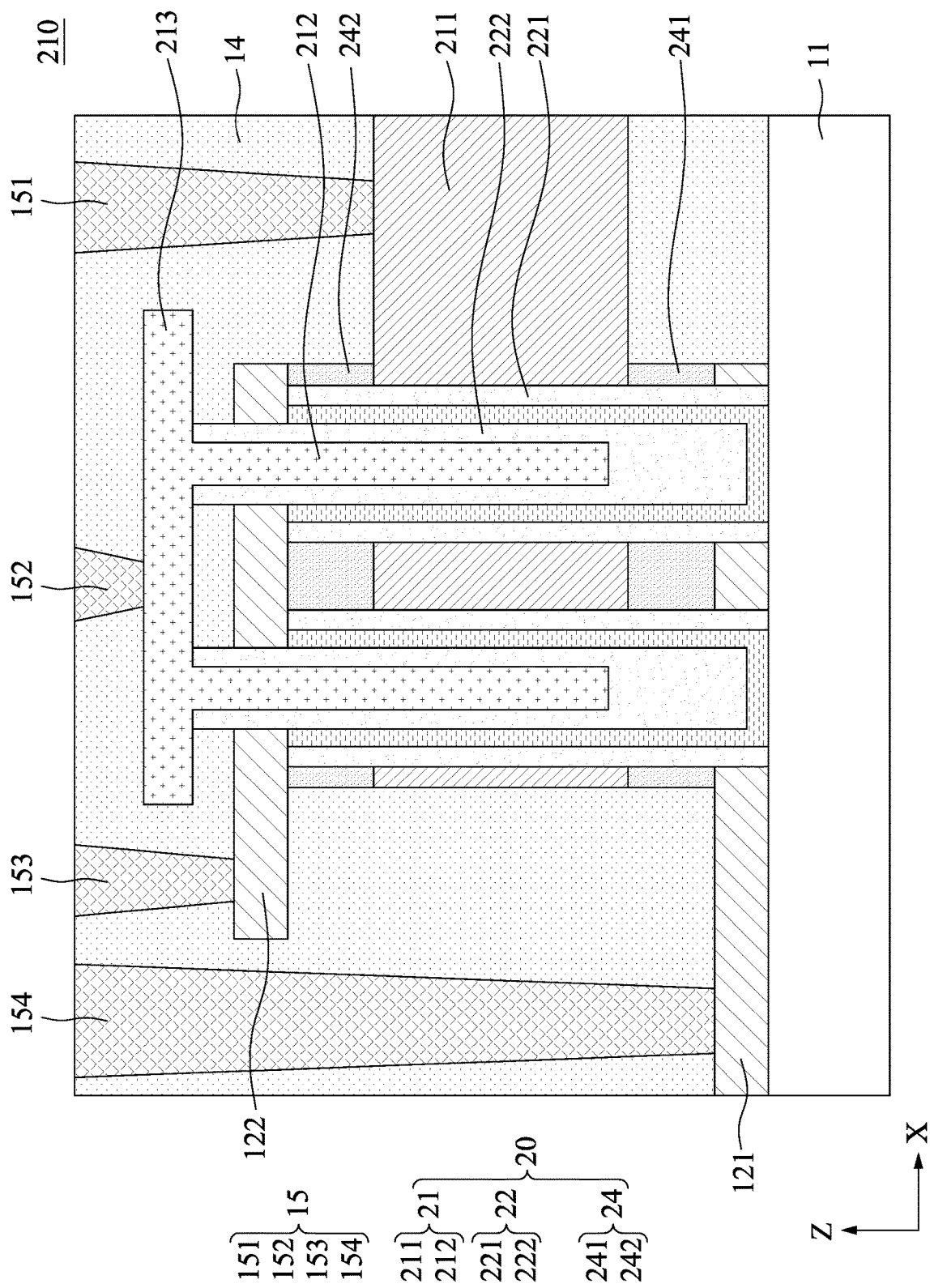
FIG. 20 is a schematic cross-sectional diagram of a semiconductor structure in accordance with some embodiments of the present disclosure.
Figure 21:
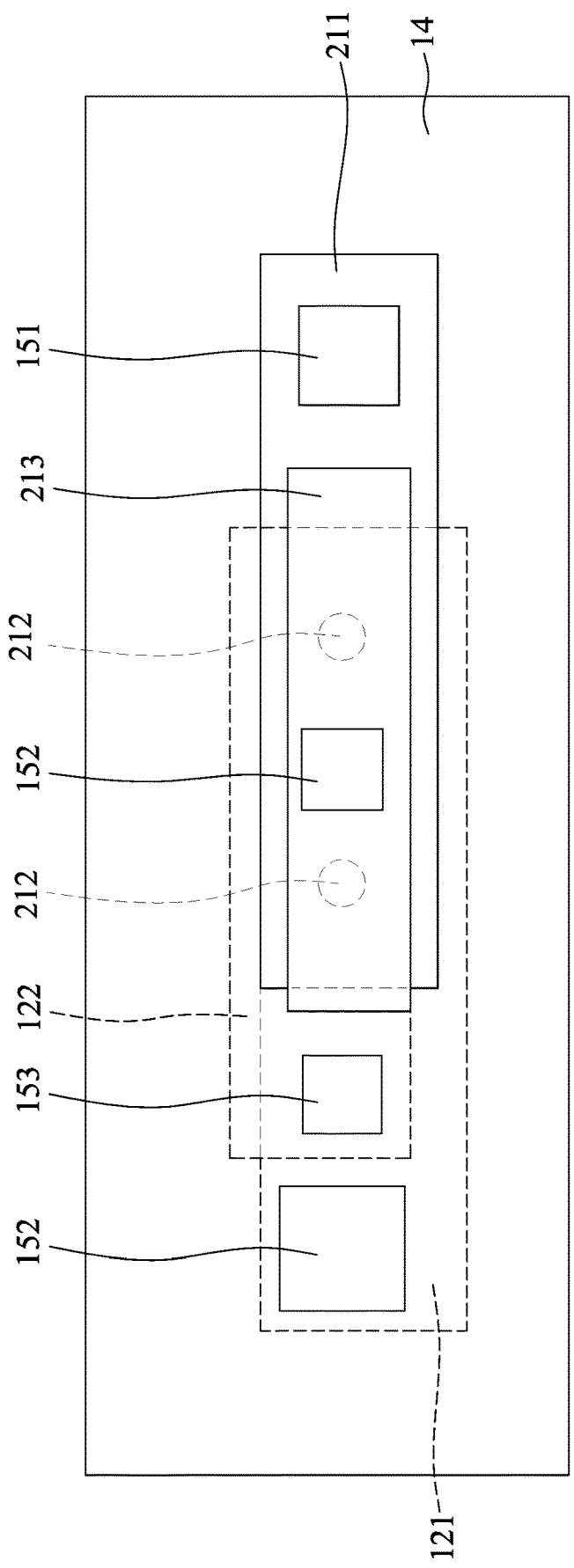
FIG. 21 is a schematic top-view perspective of the semiconductor structure of FIG. 20 in accordance with some embodiments of the present disclosure.

Referring to FIGS. 20 and 21, FIG. 20 shows a schematic cross-sectional diagram of a semiconductor structure 210 including the multiple gate structures 20 of the semiconductor structure 200, and FIG. 21 shows a schematic top-view perspective of the semiconductor structure 210 of FIG. 20 in accordance with some embodiments of the present disclosure.

In some embodiments, a plurality of contacts 15 are formed to electrically connect to the first doped structure 121, the outer gate layer 211, the second doped structure 122 and the inner gate layer 212 respectively.

In some embodiments, a first patterning operation is performed after the formation of the first doped structure 121 and prior to the formation of the first spacer layer 241 as shown in FIG. 6. In some embodiments, a dielectric layer of the isolation structure 14 is formed at a same elevation as the first doped structure 121 prior to the formation of the first spacer layer 241. In some embodiments, a portion of the first doped structure 121 is outside a coverage area of the gate structures 20 and the second doped structure 122. In some embodiments, a fourth contact 154 of the plurality of contacts 15 penetrates the isolation structure 14 over the portion of the first doped structure 121 to electrically connect to or contact the first doped structure 121.

In some embodiments, a second patterning operation is performed after the formation of the outer gate layer 211 and prior to the formation of the second spacer layer 242 as shown in FIG. 6. In some embodiments, a dielectric layer of the isolation structure 14 is formed at a same elevation as the outer gate layer 211 prior to the formation of the second spacer layer 242. In some embodiments, a portion of the outer gate layer 211 is outside a coverage area of the second spacer layer 242 and the second doped structure 122. In some embodiments, a first contact 151 of the plurality of contacts 15 in penetrates the isolation structure 14 over the portion of the outer gate layer 211 to electrically connect to or contact the outer gate layer 211.

In some embodiments, a third patterning operation is formed after the formation of the second doped structure 122 and prior to the formation of the isolation structure 14 shown in FIG. 14. In some embodiments, a dielectric layer of the isolation structure 14 is formed at a same elevation as the second doped structure 122 prior to or concurrently with the formation of the layer of the isolation structure 14 as depicted in FIG. 14. In some embodiments, a portion of the second doped structure 122 is outside a coverage area of a pad structure 213, wherein the pad structure 213 is for electrical connection to the inner gate layers 212 of the different gate structures 20 (detailed description in following paragraphs). In some embodiments, a third contact 153 of the plurality of contacts 15 penetrates the isolation structure 14 over the portion of the outer gate layer 211 to electrically connect to or contact the second doped structure 122.

For a purpose of electrical connection to the inner gate layers 212 of the different gate structures 20, the pad structure 213 is formed over the inner gate layers 212 as shown in FIG. 20. In some embodiments, the pad structure 213 electrically connects to or contacts the inner gate layers 122 of the different gate structures 20. Due to a tendency of shrinkage in sizes of semiconductor devices, a dimension of an inner gate layer 212 may be so small that a precise alignment of a contact (usually in a plug configuration) to the inner gate layer 212 is hard to achieve, and the pad structure 213 can provide electrical connection to different inner gate layers 212 for a purpose of ease of alignment with a second contact 152 of the plurality of contacts 15.

In some embodiments, the pad structure 213 can be formed concurrently with the inner gate layers 212 as depicted in FIG. 20. In some embodiments, a dielectric layer of the isolation structure 14 is formed over the semiconductor structure 200 as shown in FIG. 19, and a deposition followed by a fourth patterning operation is performed to form the pad structure 213 as shown in FIG. 20. In some embodiments, the pad structure 213 can include a material same as that of the inner gate layer 212. In alternative embodiments, the pad structure 213 can include a material same as that of the contacts 15. In some embodiments, the isolation structure 14 is further formed over the pad structure 213. In some embodiments, the second contact 152 of the plurality of contacts 15 penetrates the isolation structure 14 over the pad structure 213 to electrically connect to or contact the pad structure 213.

Referring to FIG. 21, in some embodiments, the contacts 151, 152, 153 and 154 are arranged along the second direction (e.g., X direction). However, the present disclosure is not limited thereto.

Figure 22:
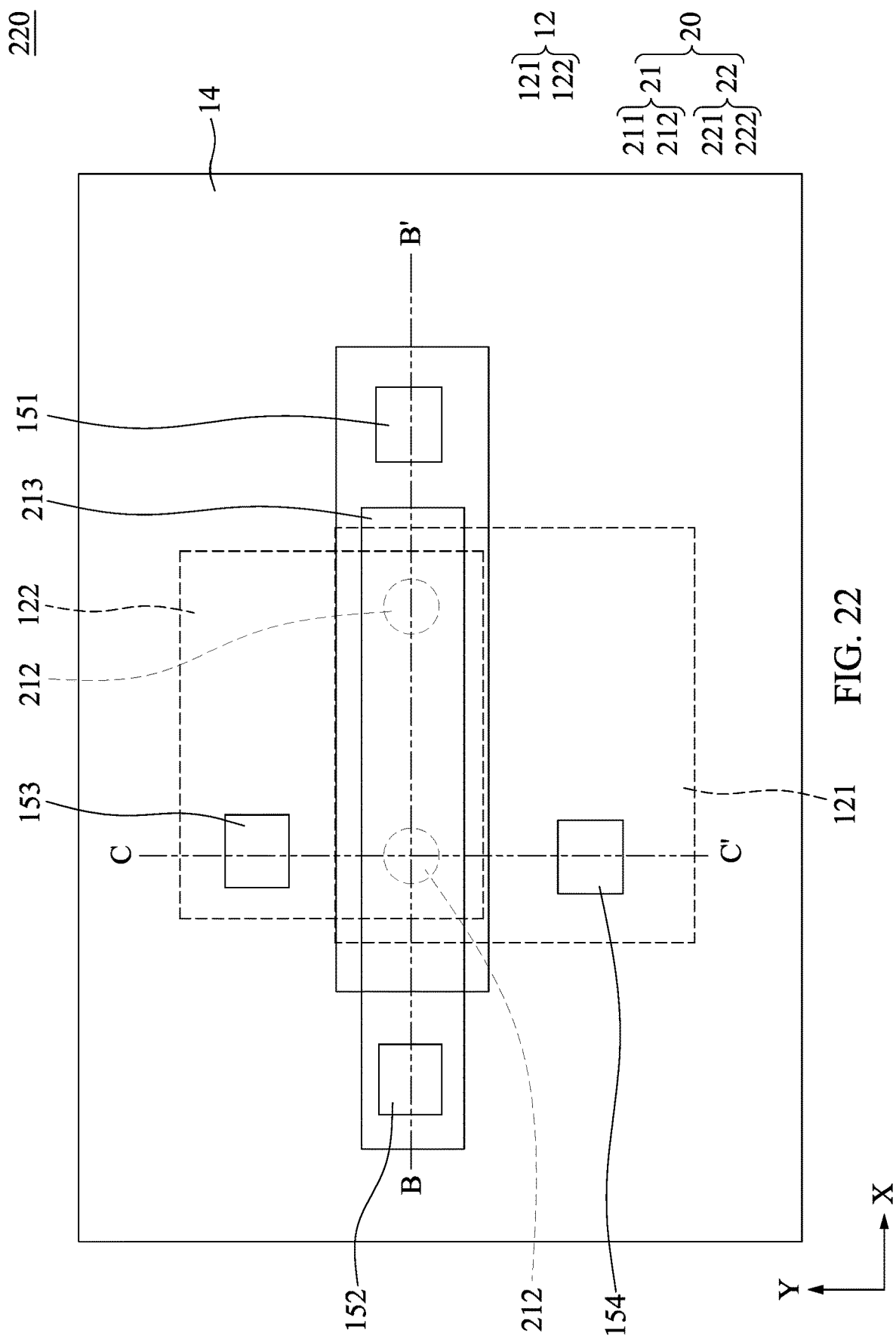
FIG. 22 is a schematic top-view perspective of a semiconductor structure in accordance with some embodiments of the present disclosure.

FIG. 22 is a schematic top-view perspective of a semiconductor structure 220, which is similar to the semiconductor structure 210 but with different arrangement of the plurality of contacts 15 and different patterns of the first and second doped structures 121 and 122 and the outer and inner gate layers 211 and 212.

In some embodiments, the contacts 151 and 152 are arranged along the second direction or the X axis, and the contacts 153 and 154 are arranged along a third direction or the Y axis, wherein the third direction is substantially orthogonal to the second direction from the top-view perspective.

Figure 23:
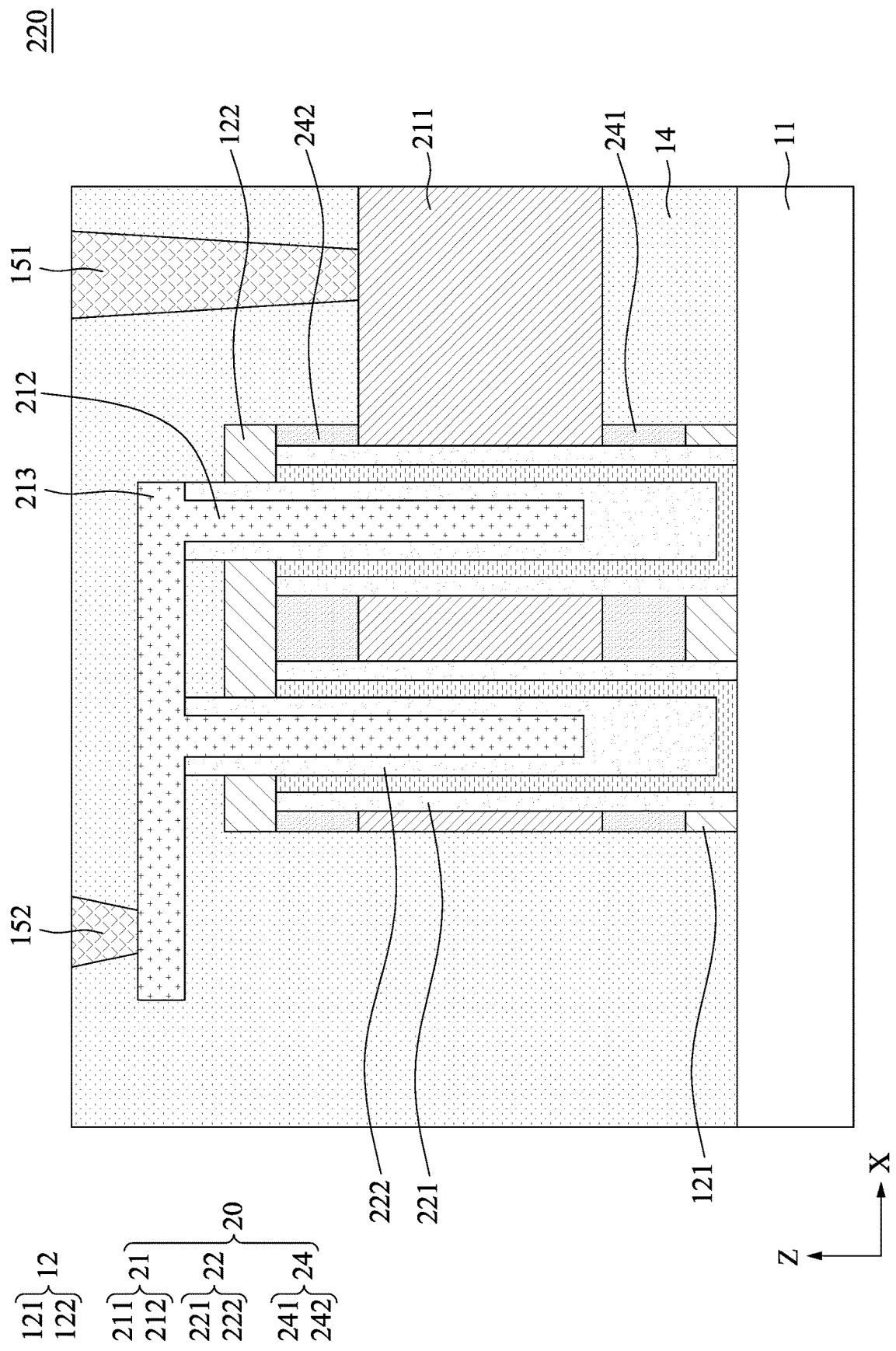
FIG. 23 is a schematic cross-sectional diagram of the semiconductor structure along a line B-B' in FIG. 22 in accordance with some embodiments of the present disclosure.

FIG. 23 is a schematic cross-sectional diagram of the semiconductor structure 220 along a line B-B' in FIG. 22 in accordance with some embodiments of the present disclosure.

Referring to FIGS. 22 and 23, according to the arrangement of the contacts 151 and 152, the outer gate layer 211 and the inner gate layer 212 should have portions exposed through other elements of the gate structures 20 and the doped structures 12 from the top-view perspective for a purpose of electrical connection to the contacts 151 and 152.

In some embodiments, a portion of the outer gate layer 211 extends along the second direction farther from the outer dielectric layer 221 than the spacer structure 24 or the doped structures 12. In some embodiments, the first contact 151 contacts a portion of the outer gate layer 211 exposed through the second doped structure 122 from the top-view perspective shown in FIG. 22.

In some embodiments, a portion of the pad structure 213 extends along the X axis, i.e., farther from the outer dielectric layer 221 than the spacer structure 24 or the doped structures 12 opposite to the outer gate layer 211. In some embodiments, the second contact 152 contacts a portion of the pad structure 213 outside a coverage area of the second doped structure 122 or a coverage area of the outer gate layer 211 from the top-view perspective shown in FIG. 22.

Figure 24:
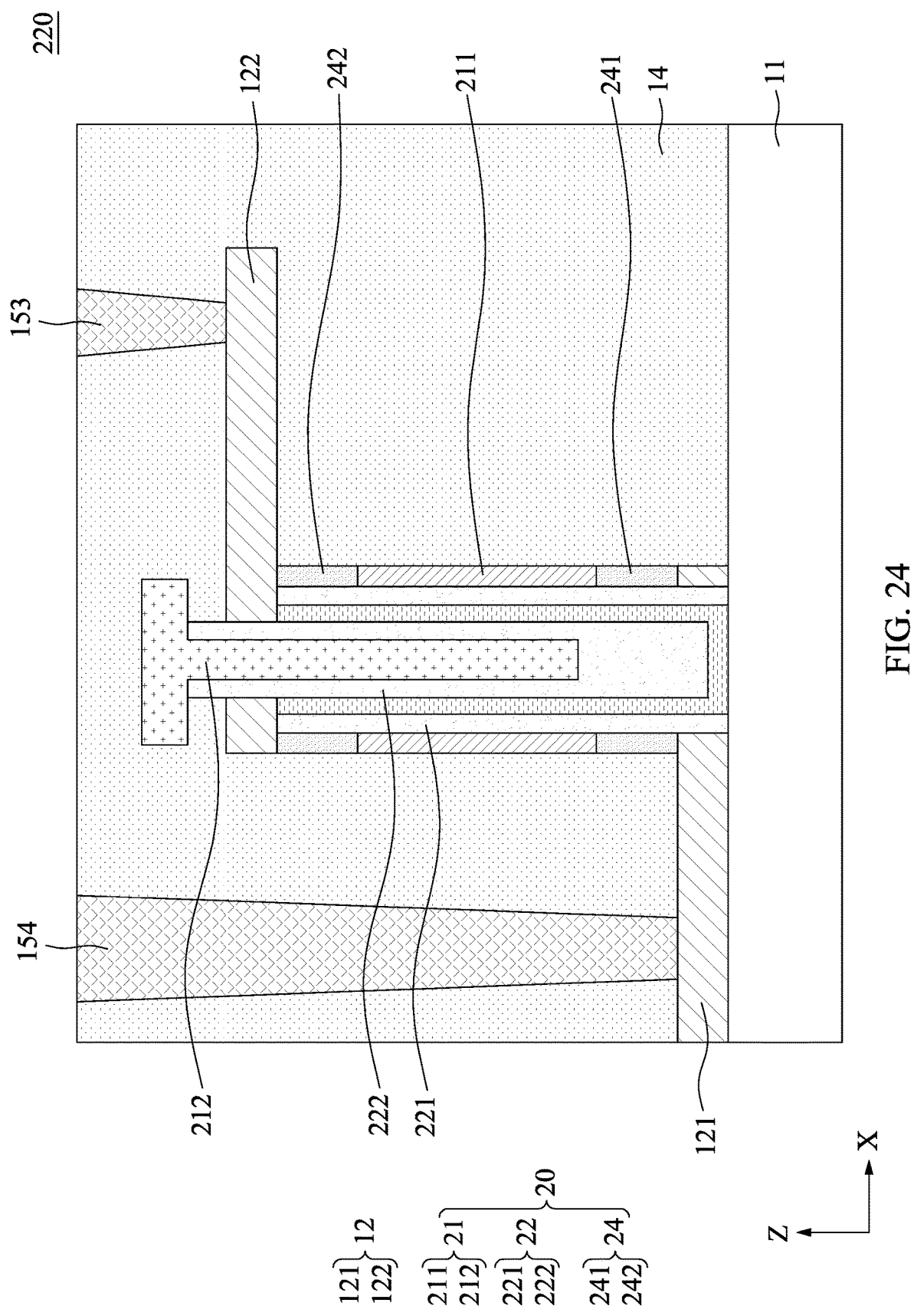
FIG. 24 is a schematic cross-sectional diagram of the semiconductor structure along a line C-C' in FIG. 22 in accordance with some embodiments of the present disclosure.

FIG. 24 is a schematic cross-sectional diagram of the semiconductor structure 220 along a line C-C' in FIG. 22 in accordance with some embodiments of the present disclosure.

Referring to FIGS. 22 and 24, according to the arrangement of the contacts 153 and 154, the first doped structure 121 and the second doped structure 122 should have portions exposed through elements of the gate structures 20 from the top-view perspective for a purpose of electrical connection to the contacts 153 and 154.

In some embodiments, a portion of the first doped structure 121 and a portion of the second doped structure 122 extend in opposite directions along the Y axis. In some embodiments, the third contact 153 contacts a portion of the second doped structure 122 not overlapped by the gate structures 20 or the first doped structure 121 from the top-view perspective shown in FIG. 22. In some embodiments, the fourth contact 154 contacts a portion of the first doped structure 121 not overlapped by the gate structures 20 or the second doped structure 122 from the top-view perspective shown in FIG. 22.

One aspect of the present disclosure provides a semiconductor structure. The semiconductor structure comprises: a first doped structure over a substrate and a second doped structure over the first doped structure and the substrate; a first gate layer, at last partially disposed between the first doped structure and the second doped structure; a first gate dielectric layer, surrounding the first gate layer; a channel layer, surrounding the first gate dielectric layer; a second gate dielectric layer, surrounding the channel layer; and a second gate layer, surrounding the second gate dielectric layer.

Another aspect of the present disclosure provides a semiconductor structure. The semiconductor structure further comprises: a vertical gate-all-around (GAA) structure; a first contact; and a second contact. The GAA structure comprises: a gate structure; and a first doped structure and a second doped structure, disposed at two opposite sides of the gate structure respectively. The gate structure comprises: an inner gate; an inner oxide, surrounding the inner gate; a channel layer, surrounding the inner oxide; an outer oxide, surrounding the channel layer; and an outer gate, surrounding the outer oxide. The first contact electrically connects the inner gate. The second spacer layer separates the second gate layer from the second doped structure.

Another aspect of the present disclosure provides a method for manufacturing a semiconductor structure. The method includes a number of operations. A first spacer layer, a first gate layer and a second spacer layer are sequentially formed over a substrate. A first opening penetrating the first spacer layer, the first gate layer and the second spacer layer is defined. A first gate dielectric layer, a channel layer, a second gate dielectric layer and a second gate layer are sequentially formed within the first opening.

In conclusion, the application discloses a manufacturing method of a semiconductor structure and a semiconductor structure thereof. The present disclosure provides a novel GAA structure, which includes an inner gate surrounded by an outer gate. The multiple gate layers of the GAA structure of the present disclosure can improve a performance of the GAA structure by adjusting biases provided to the inner gate and the outer gate respectively.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
   a first doped structure over a substrate and a second doped structure over the first doped structure and the substrate;
   a first gate layer having a lower portion disposed between the first doped structure and the second doped structure and an upper portion disposed above the second doped structure;
   a first gate dielectric layer, surrounding the first gate layer;
   a channel layer, surrounding the first gate dielectric layer;
   a second gate dielectric layer, surrounding the channel layer; and
   a second gate layer, surrounding the second gate dielectric layer.

2. The semiconductor structure of claim 1, wherein the first gate layer penetrates through the second doped structure to define the lower portion below the second doped structure and the upper portion above the second doped structure.

3. The semiconductor structure of claim 1, wherein the first gate dielectric layer penetrates through the second doped structure at a position that an upper portion of the first gate dielectric layer is disposed above the second doped structure.

4. The semiconductor structure of claim 1, wherein an entirety of the channel layer is disposed between the first doped structure and the second doped structure at a position that an upper end of the channel layer is in contact with the second doped structure while a lower end of the channel layer is in contact with the first doped structure.

5. The semiconductor structure of claim 1, wherein an entirety of the second gate dielectric layer is disposed between the first doped structure and the second doped structure at a position that an upper end of the second gate dielectric layer is in contact with the second doped structure while a lower end of the second gate dielectric is in contact with the first doped structure.

6. The semiconductor structure of claim 1, wherein an entirety of the second gate layer is disposed below the second doped structure.

7. The semiconductor structure of claim 1, further comprising:
   a first spacer layer, separating the second gate layer from the first doped structure; and
   a second spacer layer, separating the second gate layer from the second doped structure;
   wherein a thickness of the first spacer layer is equal to a thickness of the second spacer layer and is equal to a thickness of the second gate layer.

8. The semiconductor structure of claim 1, wherein the first gate dielectric layer has a base and a hollow portion extended therefrom, wherein the first gate layer is surrounded by the hollow body, wherein a first thickness of the base of the first gate dielectric layer adjacent to a bottom of the first gate layer is different from a second thickness of the hollow portion of the first gate dielectric layer adjacent to a sidewall of the first gate layer.

9. The semiconductor structure of claim 8, wherein the first thickness is greater than the second thickness.

10. The semiconductor structure of claim 1, wherein the channel layer contacts the first doped structure and the second doped structure.

11. A semiconductor structure, comprising:
    a vertical gate-all-around (GAA) structure, comprising:
       a gate structure, comprising:
          an inner gate;
          an inner oxide, surrounding the inner gate;
          a channel layer, surrounding the inner oxide;

an outer oxide, surrounding the channel layer; and
an outer gate, surrounding the outer oxide; and
a first doped structure and a second doped structure, disposed at two opposite sides of the gate structure respectively;
a first contact, in contact with a top surface of the inner gate and electrically connected to the inner gate; and
a second contact, in contact with a portion of the outer gate exposed through the second doped structure and electrically connected to the outer gate;
wherein the second doped structure is penetrated by the inner gate and the inner oxide, wherein an upper portion of the inner gate and an upper portion of the inner oxide are disposed above the second dope structure.

12. The semiconductor structure of claim 11, wherein the first doped structure is disposed at a lower end of the gate structure.

13. The semiconductor structure of claim 11, wherein the second doped structure is connected to an upper end of the channel layer and an upper end of the outer oxide.

14. The semiconductor structure of claim 11, wherein the inner oxide encircles the inner gate, the channel layer encircles the inner oxide, the outer oxide encircles the channel layer, and the outer gate encircles the outer oxide from a top-view perspective.

15. The semiconductor structure of claim 11, further comprising:
a third contact, electrically connected to the first doped structure and in contact with a portion of the first doped structure outside an overlapping area of the second doped structure and the gate structure; and
a fourth contact, in contact with the second doped structure and electrically connected to the second doped structure.

16. The semiconductor structure of claim 15, wherein the third contact and the fourth contact are electrically isolated from each other.

17. The semiconductor structure of claim 11, wherein the first contact and the second contact are electrically isolated from each other.

18. The semiconductor structure of claim 11, wherein the channel layer includes indium gallium zinc oxide (IGZO).

19. The semiconductor structure of claim 11, wherein the GAA structure further comprises:
a spacer structure, disposed between the outer gate and the first doped structure, and between the outer gate and the second doped structure.

* * * * *